(12) United States Patent
Takaura et al.

(10) Patent No.: US 7,071,485 B2
(45) Date of Patent: Jul. 4, 2006

(54) SEMICONDUCTOR INTEGRATED CIRCUIT DEVICE

(75) Inventors: Norikatsu Takaura, Tokyo (JP); Hideyuki Matsuoka, Nishitokyo (JP); Motoyasu Terao, Hinode (JP); Kenzo Kurotsuchi, Kokubunji (JP); Tsuyoshi Yamauchi, Isahaya (JP)

(73) Assignees: Hitachi, Ltd., Tokyo (JP); Hitachi Ulsi Systems Co., Ltd., Tokyo (JP)

( * ) Notice: Subject to any disclaimer, the term of this patent is extended or adjusted under 35 U.S.C. 154(b) by 0 days.

(21) Appl. No.: 10/790,764

(22) Filed: Mar. 3, 2004

(65) Prior Publication Data
US 2005/0111247 A1    May 26, 2005

(30) Foreign Application Priority Data
May 22, 2003    (JP)    ............................ P2003-145305

(51) Int. Cl.
H01L 47/00    (2006.01)
H01L 29/04    (2006.01)

(52) U.S. Cl. ........................ 257/3; 257/2; 257/E45.002

(58) Field of Classification Search .................... None
See application file for complete search history.

(56) References Cited

U.S. PATENT DOCUMENTS

| 5,596,522 | A | 1/1997 | Ovshinsky et al. | ......... 365/113 |
| 6,597,031 | B1 * | 7/2003 | Kuge | .......................... 257/295 |
| 2002/0045323 | A1 | 4/2002 | Lowrey et al. | |
| 2003/0146469 | A1 | 8/2003 | Matsuoka et al. | |
| 2003/0209746 | A1 * | 11/2003 | Horii | .......................... 257/295 |
| 2005/0030800 | A1 * | 2/2005 | Johnson et al. | ............. 365/200 |

FOREIGN PATENT DOCUMENTS

| JP | 5-21740 | 1/1993 |
| JP | 2002-540605 | 11/2002 |
| JP | 2003-100084 | 4/2003 |
| JP | 2003-100991 | 4/2003 |
| JP | 2003-229537 | 8/2003 |

* cited by examiner

*Primary Examiner*—Tu-Tu Ho
(74) *Attorney, Agent, or Firm*—Mattingly, Stanger, Malur & Brundidge, P.C.

(57) ABSTRACT

With a high-speed nonvolatile phase change memory, reliability in respect of the number of refresh times is enhanced. In a memory cell forming area of a phase change memory using a MISFET as a transistor for selection of memory cells, a phase change material layer of a memory cell comprising a resistor element, using a phase change material, is formed for common use. As a result, variation in shape and a change in composition of the phase change material, caused by isolation of memory cell elements by etching, are reduced, thereby enhancing reliability of memory cells, in respect of the number of refresh times.

16 Claims, 34 Drawing Sheets

Y-DIRECTION

X-DIRECTION

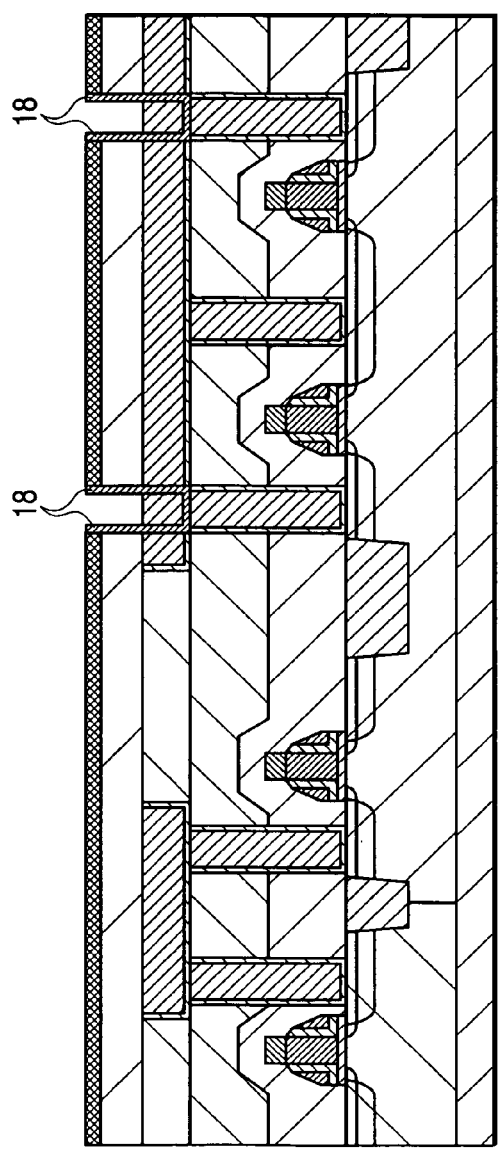
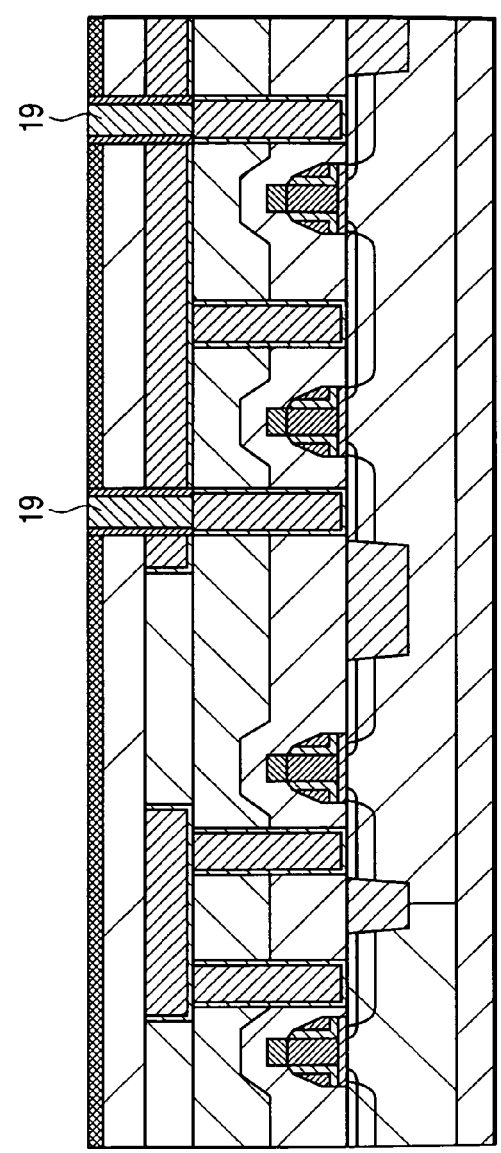
FIG. 9
FIG. 10

Y-DIRECTION

X-DIRECTION

SEMICONDUCTOR INTEGRATED CIRCUIT DEVICE

BACKGROUND OF THE INVENTION

1. Field of the Invention

The present invention relates to a semiconductor integrated circuit device, and in particular, to technology effective for application to a semiconductor integrated circuit device having a high density integrated memory circuit formed of a phase change material, a memory combined with a logic wherein a memory circuit and a logic circuit are provided on the same semiconductor substrate, or an analog circuit.

2. Description of the Related Art

With a memory combined with a logic, wherein a memory (phase change memory) using a resistor element made of, for example, a phase change material, and a logic circuit made up of MISFETs (Metal Insulator Semiconductor Field Effect Transistors), and so forth, are provided on the same semiconductor substrate, all or parts of memory cell elements adjacent to each other are formed by dividing the phase change material in, for example, an etching process. Further, a bit line contact electrode for electrically connecting a bit line for use in designating an address of each of the memory cell elements with an active area on a semiconductor substrate of each of the MISFETs is disposed between the resistor elements making up respective memory cells. One related to this type of device has been disclosed in, for example, Japanese Patent Laid-open No. 2002-540605. Further, a memory cell with a structure using a diode as a selection element by having a plate electrode made of a phase change memory material, for common use, has been disclosed (refer to, for example, Japanese Patent Laid-open No. 1993-21740, and Japanese Patent Laid-open No. 2003-100084). Still further, a memory cell with a structure using a transistor as a selection element by having a plate electrode made of a phase change memory material, for common use, has been disclosed (refer to, for example, Japanese Patent Laid-open No. 2003-100991).

With a process technology for isolating resistor elements from each other for every memory cell, the isolated surfaces of the phase change material change in characteristics. First, the isolated surfaces of the phase change material come into contact with a different material such as, for example, an inter-level insulation film, and so forth. Also, in the case of the resistor elements being isolated from each other by etching, memory cell elements vary in shape. Further, portions of the phase change material, exposed due to isolation, change in composition.

As a result, a problem has arisen in that deterioration occurs to reliability in respect of the number of refresh times of a phase change memory, for use in a highly integrated memory circuit and the memory combined with the logic, of which uniformity in electrical characteristics is required.

Further, in the case of technology whereby a bit line plug is disposed between memory cell elements, a limitation is imposed on disposition of the memory cell elements by the bit line plug.

As a result, a problem has been encountered that a limitation is imposed on integration of memory cells.

Furthermore, in the case of a phase change memory technology using a MISFET as a selection switch, memory cell lower contact electrodes connected to a phase change memory differ in shape from contact electrodes not connected to the phase change memory in order to achieve higher performance of the phase change memory.

As a result, a problem has arisen in that a process technology for use in the memory combined with the logic becomes complicated, resulting in higher cost.

SUMMARY OF THE INVENTION

It is therefore an object of the invention to provide a technology capable of enhancing reliability of memory cell elements using a phase change material, of which uniformity in electrical characteristics is required, particularly, in a semiconductor integrated circuit device having, for example, a high density integrated memory circuit formed of a phase change material, a memory combined with a logic wherein a memory circuit and a logic circuit are provided on the same semiconductor substrate, or an analog circuit.

Another object of the invention is to achieve higher integration of a semiconductor integrated circuit device.

Still another object of the invention is to achieve higher performance of the semiconductor integrated circuit device.

A further object of the invention is to achieve reduction in cost.

The above and other objects and features of the invention will be apparent from the following description of the disclosure and the accompanying drawings.

A summary of representative embodiments of the invention as disclosed by the present application is broadly described as follows.

In a memory cell area where resistor elements of a phase change memory are disposed so as to be integrated, a phase change material layer is for common use, and a memory cell upper plate electrode for common use, to be connected to a power source line, is formed in the upper layer of the phase change material layer. As a result, exposure of the phase change material layer is eliminated except for the memory cells positioned at the outermost peripheral parts of the memory cell area, and effects of etching on the shapes of the memory cell elements and variation in the composition thereof is eliminated, so that electrical characteristics of the memory cell elements become uniform, thereby enabling reliability thereof to be enhanced.

Further, a distance between sidewalls of the phase change material layer, formed for isolating the memory cell elements positioned at the outermost peripheral parts of an array area from a directly peripheral circuit of a memory adjacent thereto or a logic circuit area and so forth, by etching, is rendered still longer. Or a dummy pattern is disposed on the periphery of the memory cell elements positioned at the outermost peripheral parts of the array area. By this arrangement, effects of exposed parts of the sidewalls of the phase change material layer can be suppressed without changing a high degree of integration of a memory.

Further, memory operation is executed by turning the initial condition of the resistor elements as a whole into a high resistance condition while turning a portion of the phase change material layer into a low resistance condition. As a result, interaction between the memory cell elements in a low resistance condition can be suppressed.

Furthermore, in the phase change memory wherein the phase change material layer is for common use in the array area where the memory cell elements are disposed so as to be integrated, and the memory cell upper plate electrode for common use, to be connected to the power source line, is formed in the upper layer of the phase change material layer, bit lines are disposed under phase change recording material films. As a result, bit line plugs can be formed without penetrating through the phase change material layer, and the memory cell upper plate electrode, so that the side walls of the phase change material layer are prevented from exposure due to penetration by the bit line plugs.

Still further, in the phase change memory wherein the phase change material layer is for common use in the memory cell area where the memory cell elements are disposed so as to be integrated, and the memory cell upper plate electrode for common use, to be connected to the power source line, is formed in the upper layer of the phase change material layer, a high resistive conductive material, such as a material selected from the group consisting of TiN, TiAlN, and PolySi, only in the upper part of the memory cell lower contact electrodes, respectively.

As a result, the upper part of each of the memory cell lower contact electrodes acts as a heater generating Joule heat, and a phase change area of the phase change material layer, particularly, the phase change area in close proximity to a contact part between the plugs for the phase change memory and the phase change material layer can be changed into a desired shape.

Further, with the phase change memory, the high resistive conductive material is disposed only in the upper part of each of the memory cell lower contact electrodes connecting the phase change material layer to contact electrodes connected with respective active areas on the semiconductor substrate, for the MISFETs. As a result, while optimizing the memory cell lower contact electrode for enhancement in characteristics of the phase change memory, the contact electrodes, connected with the respective respective active areas on the semiconductor substrate for the MISFETs, along with bit line contact electrodes, can be concurrently formed, thereby enabling cost reduction.

Further, the phase change material layer is formed so as to a stacked layer made up of high-melting phase change material film and low-melting phase change material film. As a result, the shape of a phase change area of the phase change material layer can be caused to change into a desired shape along a direction in which the phase change material films are stacked.

Still further, a memory array is formed by use of the memory cell upper plate electrode sharing a plurality of the resistor elements. As a result, it is possible to suppress interaction between the memory cell elements due to operation of word lines and bit lines, designating an address of each of the memory cell elements while the memory cell is highly integrated.

Yet further, the phase change material layer is formed above the bit lines. As a result, the memory cell elements can be disposed without being affected by disposition of the bit lines and bit line contact electrodes.

Further, with the phase change memory wherein the phase change material layer is formed above the bit lines, the resistor elements are formed by dividing the phase change material layer. As a result, the resistor elements as divided can be disposed without being affected by the disposition of the bit line contact electrodes.

BRIEF DESCRIPTION OF THE DRAWINGS

FIG. 9 is a yet further sectional view of the principal parts of the substrate of the semiconductor integrated circuit device shown in FIG. 1 during the fabrication process;

FIG. 10 is another sectional view of the principal parts of the substrate of the semiconductor integrated circuit device shown in FIG. 1 during the fabrication process;

DETAILED DESCRPTION OF THE PREFERRED EMBODIMENTS

Figure 1:
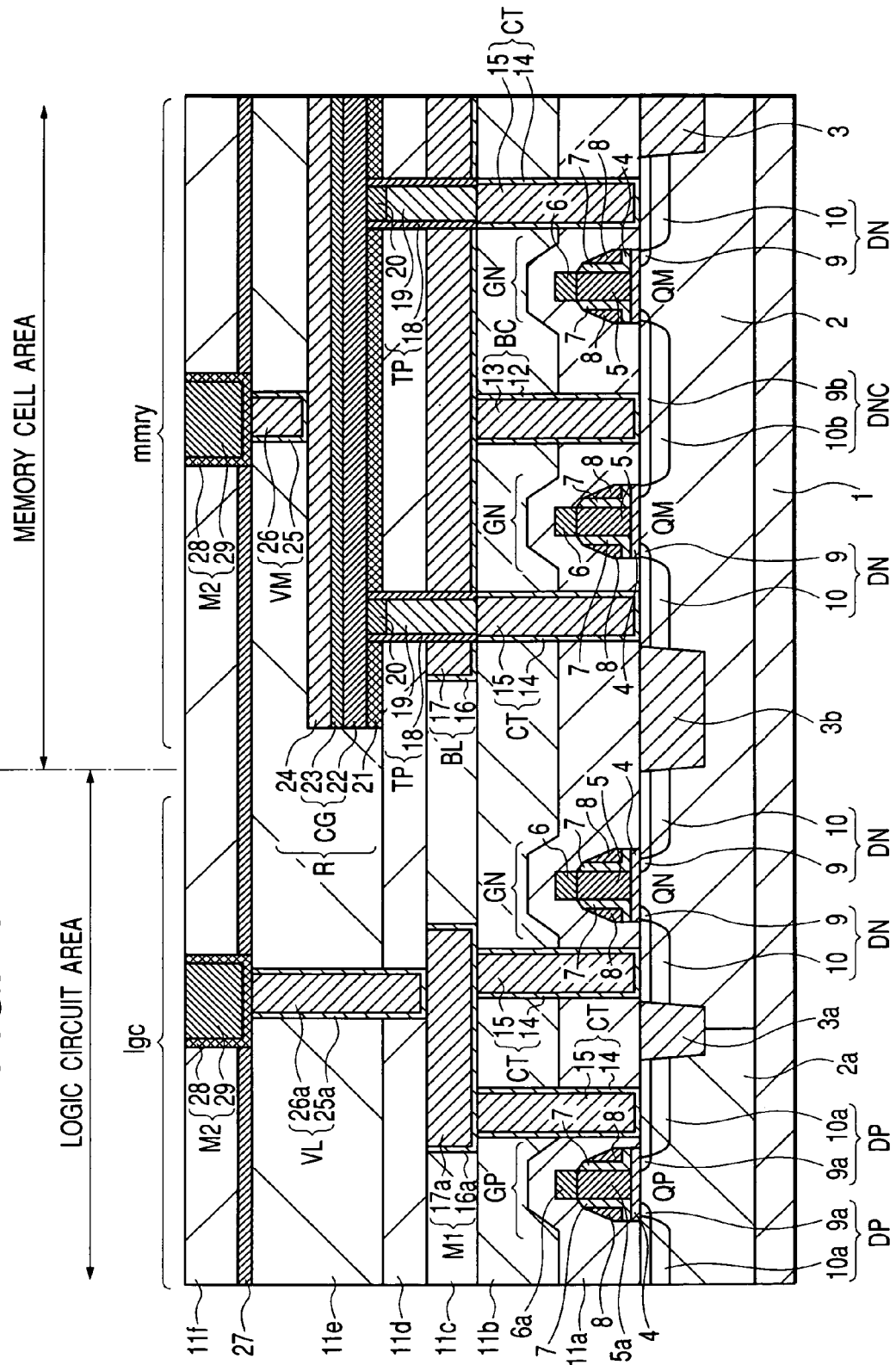
FIG. 1 is a sectional view of the principal parts of Embodiment 1 of a semiconductor integrated circuit device according to the invention.

Embodiments of the invention are described in detail hereinafter with reference to the accompanying drawings. In all figures for describing the respective embodiments, parts having the same function are denoted by like reference numerals, omitting repeated description thereof.

<Embodiment 1>

FIG. 1 is a sectional view of the principal parts of Embodiment 1 of a semiconductor integrated circuit device according to the invention. FIG. 1 shows a sectional view of a logic circuit area of a logic as well as a memory cell area of a phase change memory cell of a memory combined with a logic, and among the areas shown in FIG. 1, reference numeral lgc denotes the logic circuit area. In the logic circuit area lgc, an n-channel MISFET QN is formed. The n-channel MISFET QN has semiconductor areas DN formed in the upper parts of a p-well 2 so as to be isolated from each other, making up a LDD (Lightly Doped Drain) structure, a gate insulation film 4 formed on top of a semiconductor substrate 1, and a gate electrode GN formed on top of the gate insulation film 4.

In the logic circuit area lgc, a p-channel MISFET QP is formed. The p-channel MISFET QP has semiconductor areas DP formed in the upper parts of an n-well 2a so as to be isolated from each other, making up a LDD (Lightly Doped Drain) structure, a gate insulation film 4 formed on top of the semiconductor substrate 1, and a gate electrode GP formed on top of the gate insulation film 4.

The n-channel MISFET QN and the p-channel MISFET QP are isolated from each other with an isolation area 3a of a shallow-groove embedded type, interposed therebetween.

In the logic circuit area, the logic circuit area of the logic, a sense amplifier of the memory cell, and so forth are disposed.

Further, a memory cell area mmry where the phase change memory cell is formed is positioned. In the memory cell area, for example, n-channel MISFETs QM for selection of the memory cell are formed. The n-channel MISFETs QM for selection of the memory cell are formed in the upper parts of the p-well 2 so as to be isolated from each other, each having semiconductor areas DN, and DNC, making up a LDD (Lightly Doped Drain) structure, a gate insulation film 4 formed on top of the semiconductor substrate 1, and a gate electrode GN formed on top of the gate insulation film 4. The semiconductor area DNC is shared by the n-channel MISFETs for selection of the memory cell, adjacent to each other, formed in the same element active area.

The n-channel MISFETs QM for selection of the memory cell, p-channel MISFET QP, and n-channel MISFET QN are covered with inter-level insulation films, 11a, 11b, deposited on top of the semiconductor substrate 1.

The inter-level insulation films 11a, 11b are made up of, for example, a silicon oxide film, respectively, by, for example, the public known plasma enhanced CVD process, and so forth. The upper surface of the inter-level insulation film 11b is planarized such that a height of the inter-level insulation film 11b in the memory cell are a substantially matches that in the logic circuit area.

In the semiconductor area DNC of the memory cell area mmry, a bit line contact electrode BC made up of a barrier metal film 12 and a tungsten film 13 is formed.

The bit line contact electrode BC is electrically connected to the area DNC shared by the n-channel MISFETs QM1, QM2 for selection of the memory cell.

In the respective semiconductor areas DN of the memory cell area mmry, a metal contact electrode CT made up of a barrier metal film 14 and a tungsten film 15 is formed. The n-channel MISFETs QM1, QM2, for selection of the memory cell, and the respective semiconductor areas DN thereof are electrically connected with the metal contact electrode CT. In the semiconductor area DP of the logic circuit area, a metal contact electrode CT made up of a barrier metal film 14 and a tungsten film 15 is formed. The metal contact electrode CT is electrically connected with the semiconductor area DP of the p-channel MISFET QP.

In the semiconductor area DN of the logic circuit area, a metal contact electrode CT made up of a barrier metal film 14 and a tungsten film 15 is formed. The metal contact electrode CT is electrically connected with the semiconductor area DN of the n-channel MISFET QN.

An inter-level insulation film 11c is deposited on top of the inter-level insulation film 11b. The inter-level insulation film 11c is made up of, for example, a silicon oxide film and is formed by, for example, the public known plasma enhanced CVD process, and so forth.

In the inter-level insulation film 11c, a bit line BL and a first layer interconnect M1 are formed. The bit line BL is formed by depositing a barrier metal film 16, made up of, for example, a titanium film and a titanium nitride film, and a tungsten film 17 in that order from a lower layer. The bit line BL is electrically connected with the bit line contact electrode BC, and is further electrically connected with the semiconductor area DNC of the n-channel MISFET QM for selection of the memory cell through the intermediary of the bit line contact electrode BC.

The first layer interconnect M1 of the logic circuit area is formed by depositing a barrier metal 16a made up of, for example, a titanium film and a titanium nitride film, and a tungsten film 17a in that order from a lower layer. The first layer interconnect M1 is electrically connected with the metal contact electrode CT, and is further electrically connected with the semiconductor area DP of the p-channel MISFET QP and the semiconductor area DN of the n-channel MISFET QN through the intermediary of the metal contact electrode CT.

An inter-level insulation film 11d is deposited on the upper surface of the inter-level insulation film 11c. The inter-level insulation film 11d is made of, for example, silicon oxide. The upper surface of the inter-level insulation film 11d is planarized such that a height of the inter-level insulation film 11d in the memory cell area mmry substantially matches that in the logic circuit area lgc.

In the inter-level insulation film 11d of the memory cell area mmry, contact holes for exposing the top of the metal contact electrodes CT, respectively, are bored.

In the respective contact holes, a spacer insulation film 18 made of, for example, silicon nitride or silicon oxide, and a conductive material 19 made of, for example, tungsten are embedded, and further, on top thereof, a high resistive conductive material 20 made of, for example, titanium nitride is embedded.

A memory cell lower contact electrode TP is electrically connected with the metal contact electrodes CT, and is further electrically connected with the respective semiconductor areas DN of the n-channel MISFETs QN for selection of the memory cell through the intermediary of the respective metal contact electrodes CT. That is, the memory cell lower contact electrodes TP and each of the metal contact electrodes CT make up a two-stage plug electrode.

An inter-level insulation film 11e is deposited on the upper surface of the inter-level insulation film 11d. The inter-level insulation film 11e is made of, for example, silicon oxide.

In the inter-level insulation film 11e of the memory cell area mmry, a resistor element R serving as a memory element is formed.

The resistor element R is formed in a plate-like shape, and comprises a phase-shift-material-peel-preventive film 21 made of, for example, silicon nitride, a phase change material layer CG made up of a phase change recording material film 22 covering the surface of the phase-shift-material-peel-preventive film 21, and, for example, a phase change recording material film 23 differing from the phase change recording material film 22, and a memory cell upper plate electrode 24 made of, for example, of tungsten, covering the surface of the phase change material layer CG The phase change recording material films 22, 23, making up the phase change material layer CG are made of, for example, chalcogenide $Ge_2Sb_2Te_5$, or $Ge_3Sb_2Te_6$.

The lower part of the resistor element R is electrically connected with the memory cell lower contact electrode TP, and is electrically connected with the respective semiconductor areas DN of the n-channel MISFETs QM for selection of the memory cell through the intermediary of the memory cell lower contact electrode TP.

The resistor element R is formed in such a way as to cover a plurality of the memory cell lower contact electrodes TP each corresponding to a unit bit of the memory cell.

In the inter-level insulation film 11e of the memory cell area mmry, a contact hole for exposing a portion of the upper surface of the memory cell upper plate electrode 24 is bored. In the contact hole, a barrier metal film 25 made up of, for example, a titanium film and a titanium nitride film is embedded and further, a metal film 26 made of tungsten is embedded therein, forming a via VM in a memory cell area.

In the inter-level insulation films 11d, 11e of the logic circuit area lgc, a contact hole for exposing a portion of the upper surface of the first layer interconnect M1 is bored. In the contact hole, a barrier metal film 25a made up of, for example, a titanium film and a titanium nitride film is embedded and further, a metal film 26a made of tungsten is embedded therein, forming a via VL in a logic circuit area.

The upper surface of the inter-level insulation film 11e is planarized such that a height of the inter-level insulation film 11e in the memory cell area mmry substantially matches that in the logic circuit area lgc.

An inter-level insulation film 11f is deposited on top of the inter-level insulation film 11e. The inter-level insulation film 11f is made of, for example, silicon oxide. In the inter-level insulation film 11f, a second layer interconnect M2 is formed.

Now, a layout of the principal parts of the memory cell area according to Embodiment 1 is described with reference to FIGS. 2 and 3.

Figure 2:
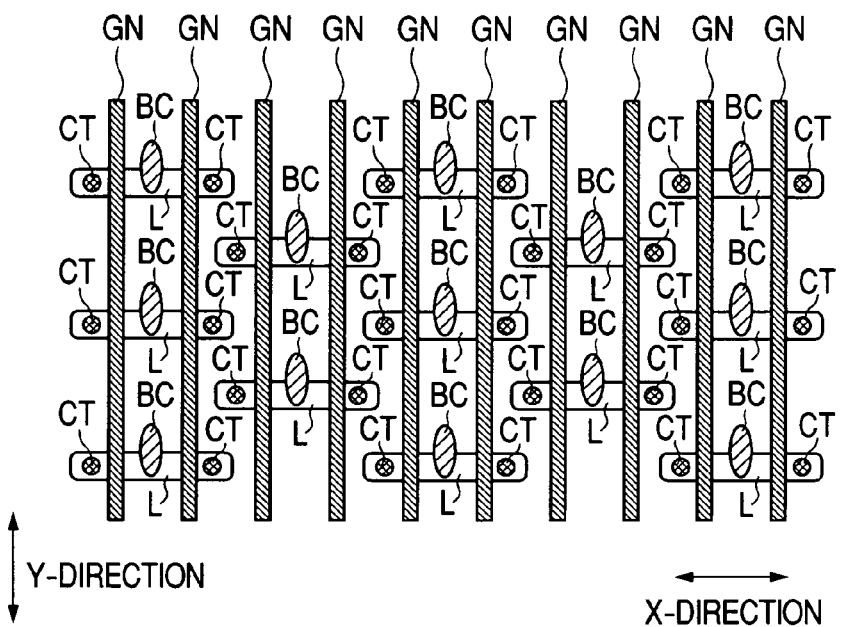
FIG. 2 is a layout view of the principal parts of the semiconductor integrated circuit device shown in FIG. 1.

First, as shown in FIG. 2, active areas (element active areas or element forming areas) L of the n-channel MISFETs, each having the gate electrodes GN, are formed over the p-well 2. These gate electrodes GN are used as word lines of a memory cell array.

Further, the metal contact electrodes CT are formed on the respective active areas L of these n-channel MISFETs.

Furthermore, the bit line contact electrode BC is formed on the respective active areas L of these n-channel MISFETs. The bit line contact electrodes BC are formed so as to be protruded along the y-direction of the respective active areas L of the n-channel MISFETs.

Figure 3:
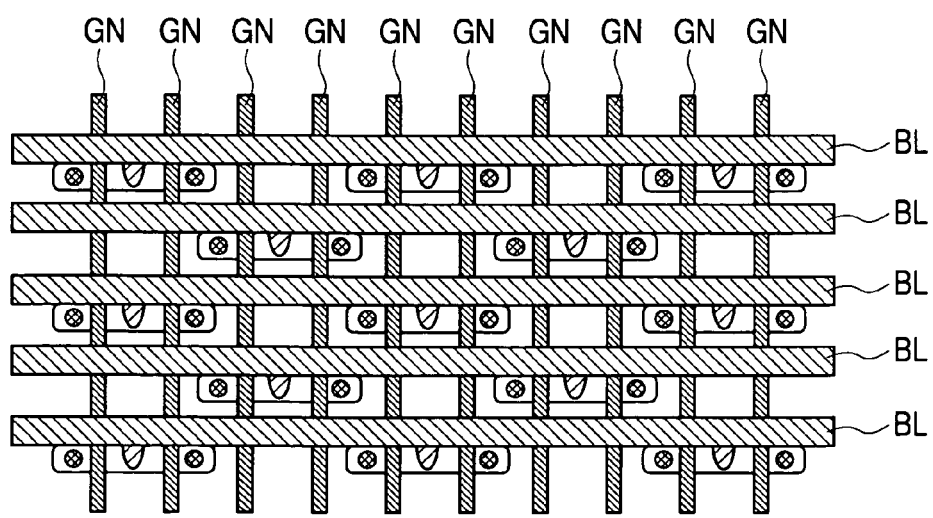
FIG. 3 is another layout view of the principal parts of the semiconductor integrated circuit device shown in FIG. 1.

Further, as shown in FIG. 3, the respective bit lines BL are disposed so as to come into contact with the upper part of a portion of each of the bit line contact electrodes BC, protruded in the y-direction of the respective active areas L of the n-channel MISFETs.

Further, the respective memory cell lower contact electrodes TP are formed on respective tops of the metal contact electrodes CT (not shown).

Still further, the phase change material layer CG is formed across the plane of a layout view of the principal parts, shown in FIGS. 2 and 3, respectively. The phase change material layer CG is connected with the memory cell lower contact electrodes TP and the memory cell upper plate electrode 24.

Needless to say, the active areas L, shown in FIGS. 2 and 3, respectively, are disposed with a periodicity.

Further, needless to say, the gate electrodes GN for use as the respective word lines, shown in FIGS. 2 and 3, respectively, are parallel to each other and continuous in the memory cell area, that is, are disposed along the x-direction.

Furthermore, needless to say, the respective bit lines shown in FIGS. 2 and 3, respectively, are parallel to each other and continuous in the memory cell area, that is, are disposed along the y-direction.

As shown in FIG. 3, the present embodiment is characterized in that the respective metal contact electrodes CT are disposed between the bit lines BL adjacent to each other in a plane layout.

Now, the semiconductor integrated circuit device according to Embodiment 1 of the invention is described in detail with reference to FIGS. 4 to 17 while following steps of a fabrication process thereof. In all figures for describing the present embodiment, parts having the same function are denoted by like reference numerals, omitting repeated description thereof.

First, the MISFETs are formed by the public known process. The semiconductor substrate 1 is made of monocrystalline silicon of a p-typed conductivity. Further, by use of the public known process, the p-well 2 is formed in the logic circuit area lgc as well as the memory cell area mmry of the semiconductor substrate 1. Furthermore, the n-well 2a is formed in the logic circuit area lgc of the semiconductor substrate 1.

In the upper layer of the semiconductor substrate 1 as described above, the isolation areas 3, 3a, 3b, of the shallow-groove embedded type are formed by the public known process. Areas defined by the isolation areas (insulation films 3, 3a, 3b), respectively, are the so-called active areas, and in respective portions thereof, elements and so forth are formed. The gate insulation films 4 on the semiconductor substrate 1 are made of, for example, silicon nitride, and are set to have a thickness in a range of, for example, on the order of 1.5 to 10 nm.

Subsequently, by use of the public known process, an n-typed polycrystalline silicon film 5 and a p-typed polycrystalline silicon film 5a are formed. Then, by use of the public known process, LDD active areas 9 of the n-channel MISFETs, respectively, and LDD active areas 9a of the p-channel MISFET, respectively, are formed. Thereafter, by use of the public known process, sidewall spacers 7, made up of, for example, a silicon oxide film, and sidewall spacers 8, made up of for, example, a silicon nitride film, are formed. Subsequently, by use of the public known process, active areas 10 of the n-channel MISFETs, respectively, as well as active areas 10a of the p-channel MISFET, and n-typed polycide films 6 as well as a p-typed polycide film 6a are formed. Then, by use of the public know process, inter-level insulation films 11a, 11b are formed.

Figure 4:
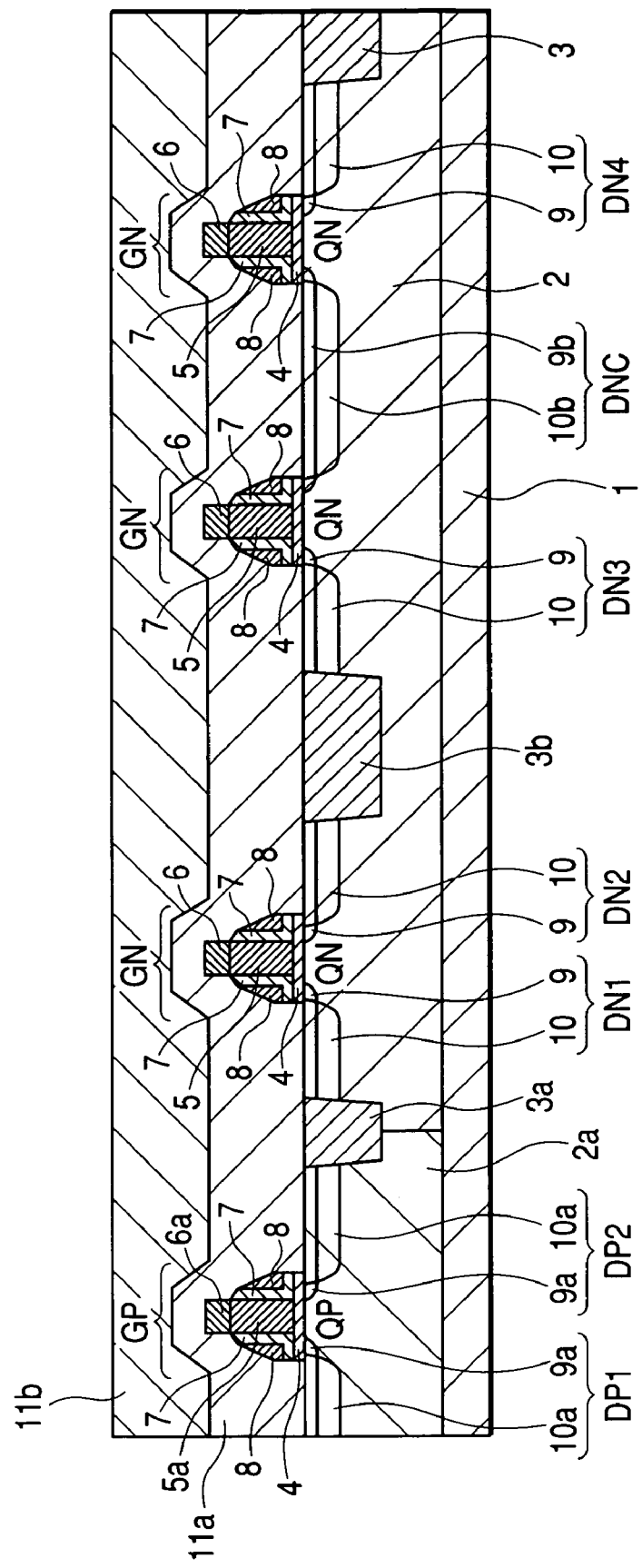
FIG. 4 is a sectional view of the principal parts of a substrate of the semiconductor integrated circuit device shown in FIG. 1 during a fabrication process.

Thus, with the MISFETs, the polycide gate electrode structures GN, GP, the diffusion layer areas DN, DNC, DP, the sidewall spacers 7, 8, the inter-level insulation films, 11a, 11b are formed by use of the public known processes, respectively. The upper surface of the inter-level insulation film 11b is planarized such that a height thereof in the memory cell area substantially matches that in the logic circuit area as shown in FIG. 4.

Subsequently, a photo resist for the formation of the contact holes in the logic circuit area, the contact holes in the memory cell area, and holes for bit lines in the memory cell area is formed on top of the inter-level insulation film 11b, and by use of the photo resist as an etching mask, the contact holes are bored in the inter-level insulation films, 11a, 11b, respectively, so as to expose the respective upper surfaces of the semiconductor areas DN of the n-channel MISFET QN, the semiconductor areas DP of the p-channel MISFET QP, semiconductor area DN of the n-channel MISFETs QM for selection of the memory cell, respectively, and semiconductor area DNC for both the n-channel MISFETs QM for selection of the memory cell.

Figure 5:
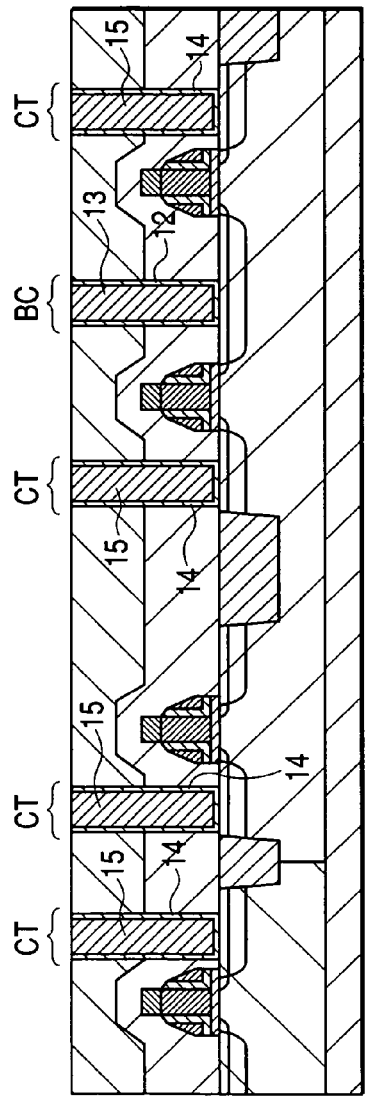
FIG. 5 is another sectional view of the principal parts of the substrate of the semiconductor integrated circuit device shown in FIG. 1 during the fabrication process.

Subsequently, after the removal of a photo resist pattern, the barrier metal film 14 made up of, for example, a titanium film and a titanium nitride film is deposited in that order from a lower layer on the semiconductor areas DN, DP, DNC, by a sputtering process, and so forth. On top of stacked films, for example, a tungsten film 15 is stacked by a CVD process, and so forth, to be embedded in the respective contact holes, thereby forming the metal contact electrodes CT, and the bit line contact electrodes BC. Then, the metal contact electrodes CT, and the bit line contact electrodes BC are etched back until the upper part of the inter-level insulation film 11b is exposed such that the respective heights of the metal contact electrodes CT in the respective contact holes matches those of the bit line contact electrodes BC in the contact holes, thereby completely isolating the respective metal contact electrodes CT and the bit line contact electrodes BC from each other, whereupon a structure as shown in FIG. 5 is formed.

Thereafter, an insulation film made of, for example, silicon nitride is deposited (not shown) on the entire surface for use as an etch back stopper for the inter-level insulation film 11b.

Subsequently, after depositing the inter-level insulation film 11c, made of, for example, silicon oxide, on the semiconductor substrate 1, a photo resist for the formation of the first layer interconnect for the logic circuit and the bit lines is formed on top of the inter-level insulation film 11c, and by use of the photo resist as an etching mask, first layer interconnect grooves for the logic circuit and bit line grooves, exposing portions of the upper surface of the inter-level insulation film 11b, are formed.

Figure 6:
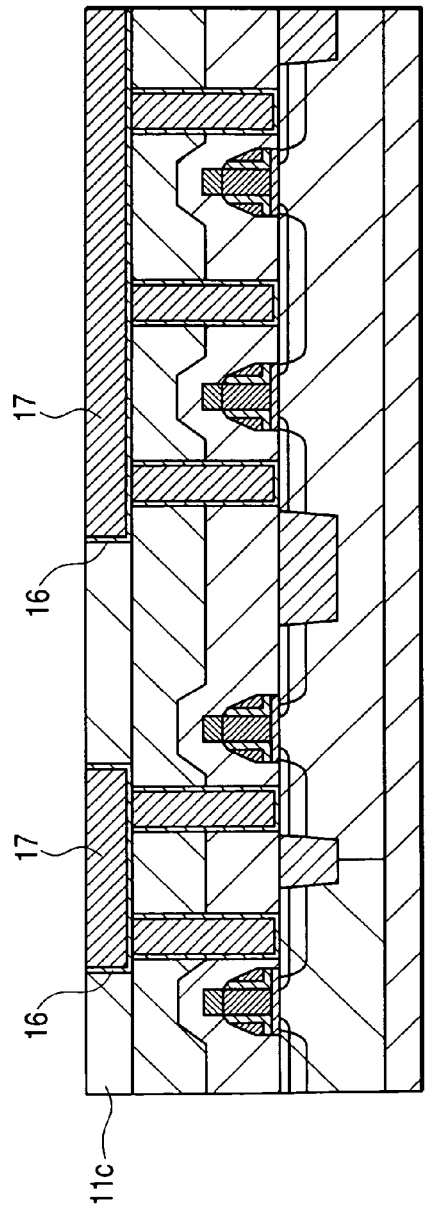
FIG. 6 is still another sectional view of the principal parts of the substrate of the semiconductor integrated circuit device shown in FIG. 1 during the fabrication process.

Subsequently, the barrier metal film 16, made up of, for example, the titanium film and titanium nitride film, is deposited in that order from the lower layer by the sputtering process and so forth, the tungsten film 17 is stacked thereon by the CVD process, and so forth, to form a conductive film, and the conductive film is etched back until the upper surface of the inter-level insulation film 11c is exposed and the height of the upper surface of the bit line BL in the respective grooves matches that of the first layer interconnect M1 in the respective grooves, thereby completely isolating the respective bit lines BL and the respective first layer interconnects M1 from each other, whereupon a structure as shown in FIG. 6 is formed.

Figure 7:
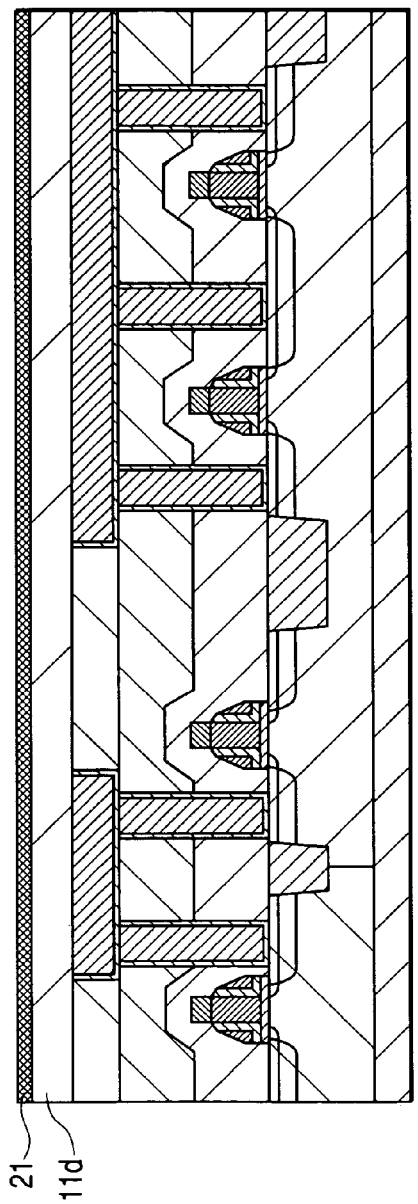
FIG. 7 is a further sectional view of the principal parts of the substrate of the semiconductor integrated circuit device shown in FIG. 1 during the fabrication process.

Thereafter, the inter-level insulation film 11d made of, for example, silicon oxide is deposited on the surface, and subsequently, the phase-shift-material-peel-preventive film 21 made of, for example, silicon nitride is deposited thereon, whereupon a structure as shown in FIG. 7 is formed.

Figure 8:
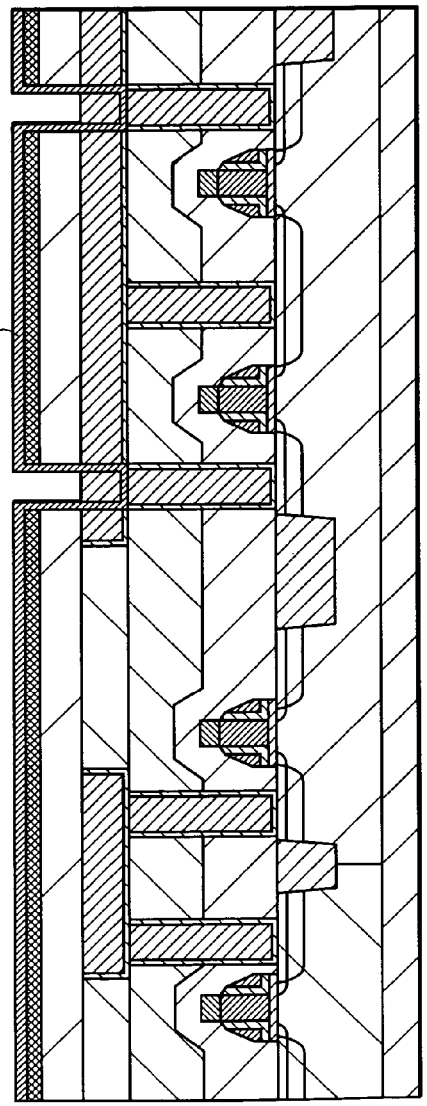
FIG. 8 is a still further sectional view of the principal parts of the substrate of the semiconductor integrated circuit device shown in FIG. 1 during the fabrication process.

Subsequently, the contact hole in the upper portion of each of the two-stage plug electrodes in the memory cell area, exposing the upper surface of the metal contact electrodes CT in the lower portion of each of the two-stage plug electrodes, is formed by lithographic and dry etching processes, and the spacer insulation film 18 made of, for example, silicon nitride is deposited on the entire surface, whereupon a structure as shown in FIG. 8 is formed.

Thereafter, anisotropic etch back is applied to the spacer insulation film 18, thereby exposing the upper surface of the metal contact electrodes CT, whereupon a structure as shown in FIG. 9 is formed.

Subsequently, the barrier metal film (not shown), made up of, for example, the titanium film and titanium nitride film, is deposited in that order from a lower layer by the sputtering process and so forth. On a stacked film, the conductive material 19 made of, for example, tungsten is stacked by the CVD process and so forth to be embedded in the contact holes, and the conductive material 19 is etched back by use of the public known CMP process until the upper surface of the phase-shift-material-peel-preventive film 21 is exposed and the upper surface of the conductive material 19 in the respective contact holes is flush with the upper surface of the phase-shift-material-peel-preventive film 21, thereby completely isolating the respective conductive materials 19 from each other, whereupon a structure as shown in FIG. 10 is formed.

Figure 11:
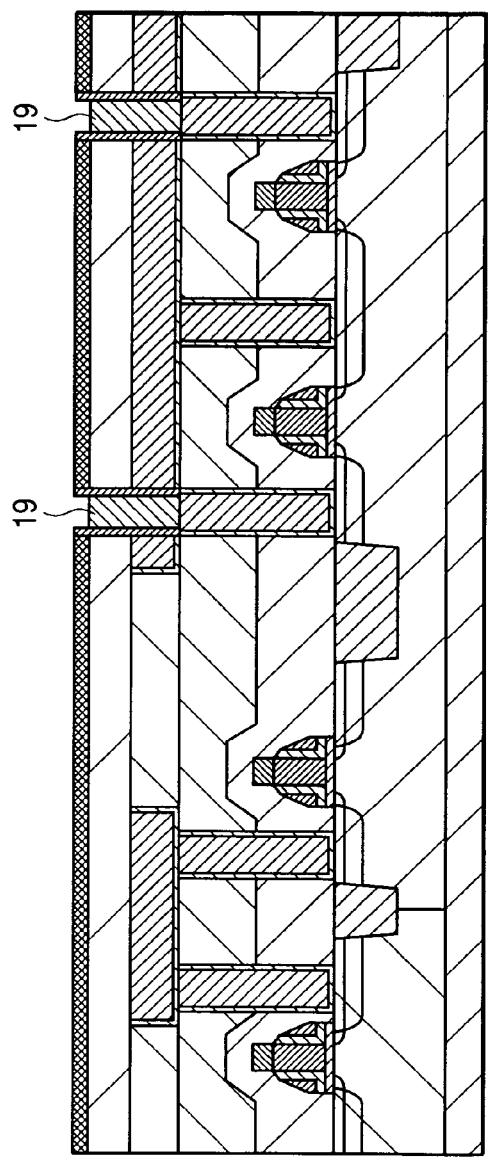
FIG. 11 is still another sectional view of the principal parts of the substrate of the semiconductor integrated circuit device shown in FIG. 1 during the fabrication process.

Thereafter, the conductive material 19 in the respective contact holes is etched back by, for example, 20 nm, whereupon a structure as shown in FIG. 11 is formed.

Figure 12:
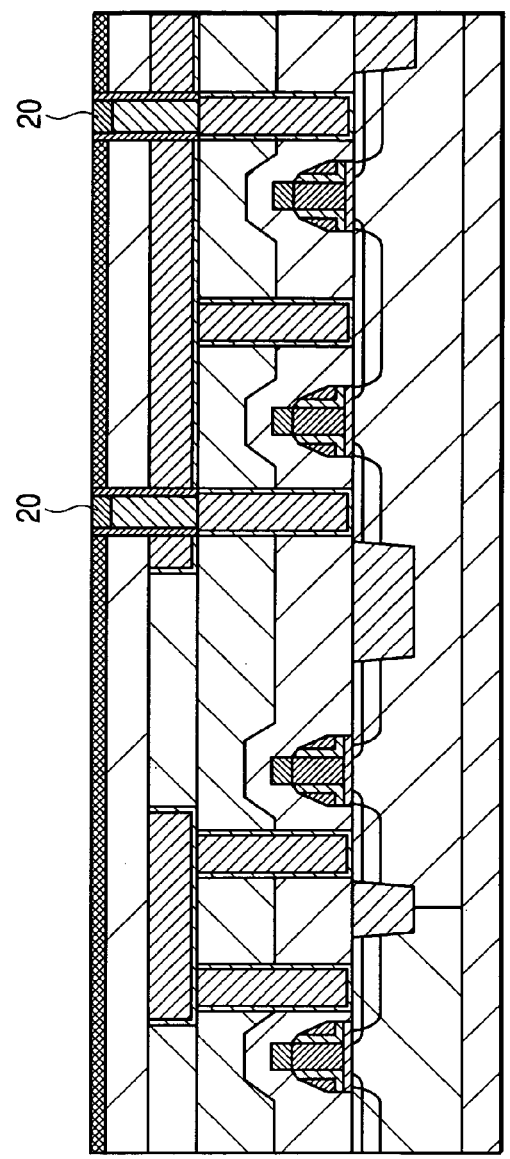
FIG. 12 is a further sectional view of the principal parts of the substrate of the semiconductor integrated circuit device shown in FIG. 1 during the fabrication process.

Subsequently, a high resistive metal film 20, made up of, for example, a titanium film and titanium nitride film, is deposited in that order from a lower layer by the sputtering process and so forth, to be embedded in the respective contact holes. Then, the high resistive metal film 20 is etched back until the upper surfaces of the memory cell lower contact electrodes TP are flush with the upper surface of the phase-shift-material-peel-preventive film 21, thereby completely isolating the respective memory cell lower contact electrodes TP from each other, whereupon a structure as shown in FIG. 12 is formed.

Further, with the present embodiment, the contact holes for the memory cell lower contact electrodes are filled up with the high resistive metal film 20, however, use may be made of a metal film excellent in CMP planarization characteristics, capable of planarizing the upper surfaces of the memory cell lower contact electrodes. For example, Mo (molybdenum) small in grain size may be used. Metal excellent in CMP planarization characteristics has an advantageous effect of suppressing localized phase change due to electric field concentration occurring to uneven portions of contact metal.

As a result, a memory cell element is improved in respect of uniformity in electric characteristics, reliability in the number of refresh times, and high-temperature resistant operation characteristics.

Figure 13:
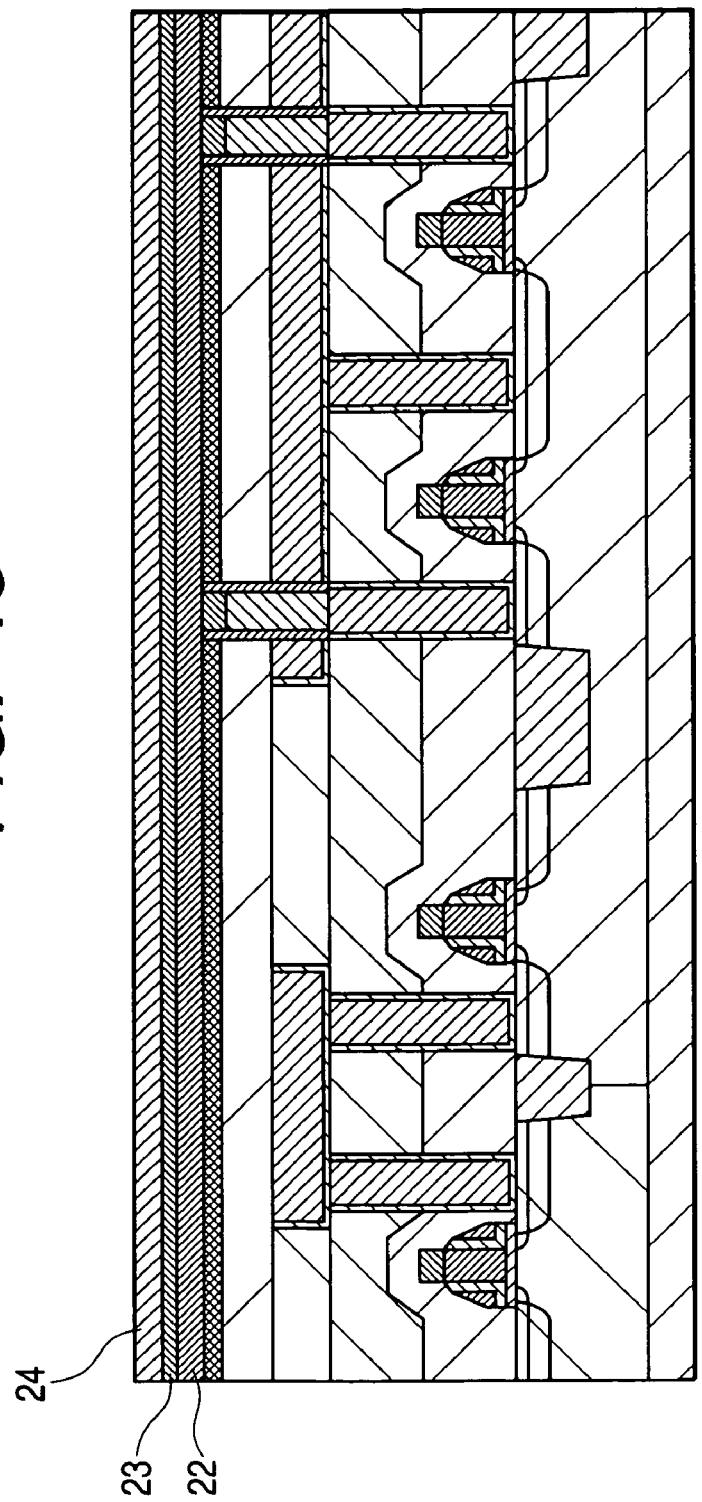
FIG. 13 is a still further sectional view of the principal parts of the substrate of the semiconductor integrated circuit device shown in FIG. 1 during the fabrication process.

Subsequently, the phase change recording material film 22, the phase change recording material film 23 having, for example, a melting point different from that of the phase change recording material film 22, and the metal film 24, made of, for example, tungsten, are deposited in that order, whereupon a structure as shown in FIG. 13 is formed.

Figure 14:
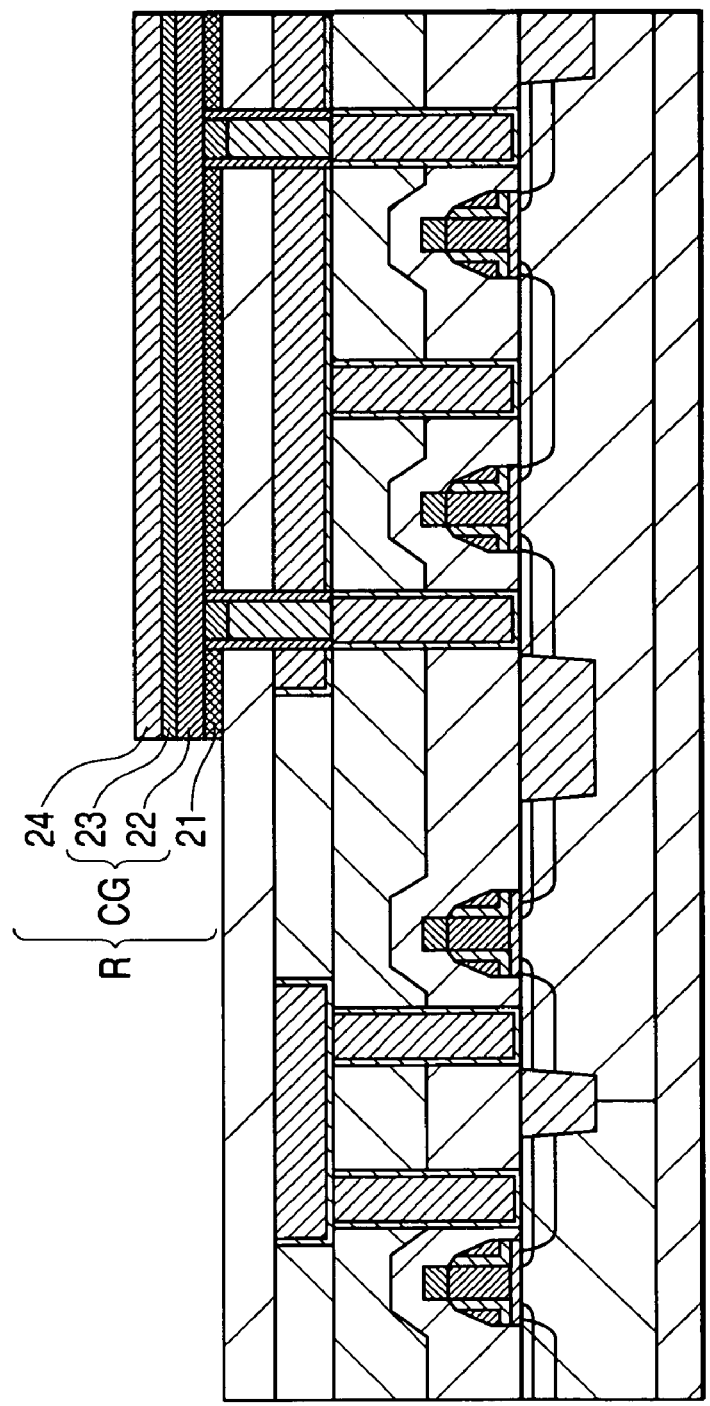
FIG. 14 is a yet further sectional view of the principal parts of the substrate of the semiconductor integrated circuit device shown in FIG. 1 during the fabrication process.

Thereafter, the phase-shift-material-peel-preventive film 21, the phase change recording material film 22, the phase change recording material film 23, and the tungsten film 24 are worked into the resistor element R, whereupon a structure as shown in FIG. 14 is formed.

Figure 15:
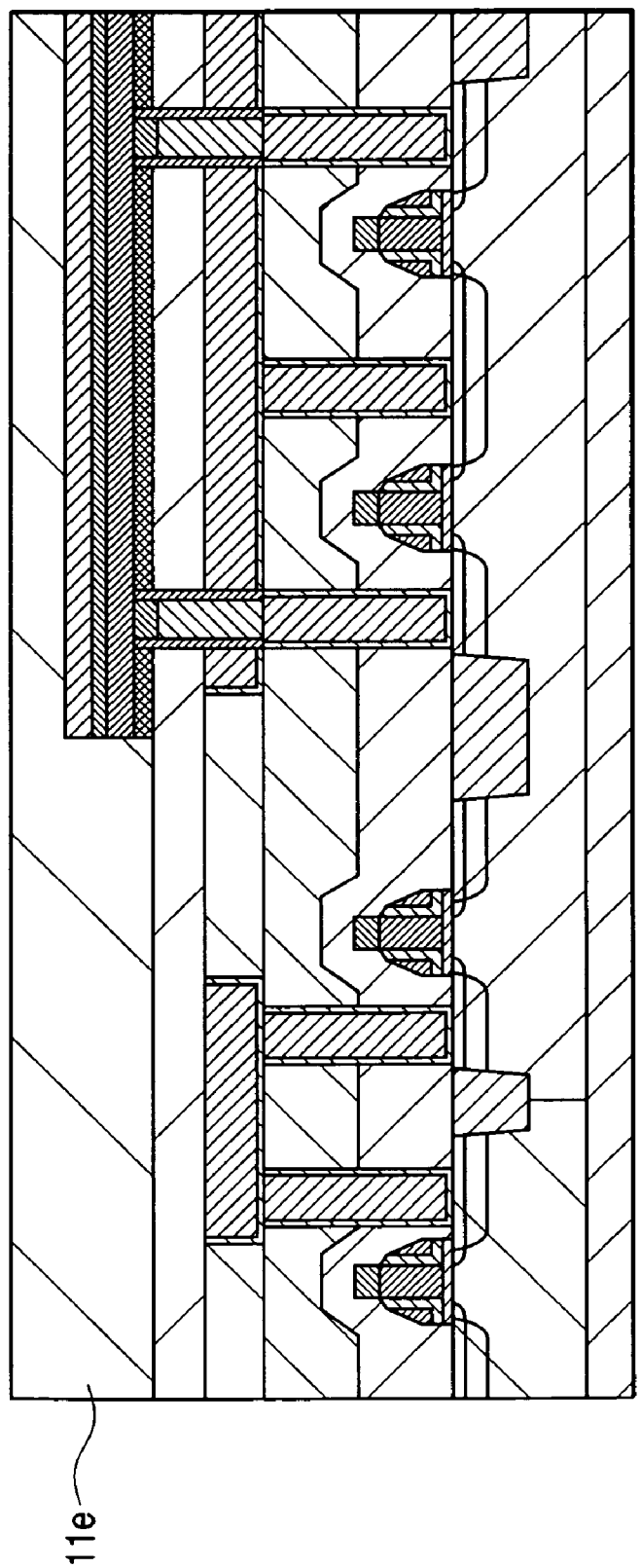
FIG. 15 is another sectional view of the principal parts of the substrate of the semiconductor integrated circuit device shown in FIG. 1 during the fabrication process.

Subsequently, the inter-level insulation film 11e is deposited thereon, whereupon a structure as shown in FIG. 15 is formed.

Figure 16:
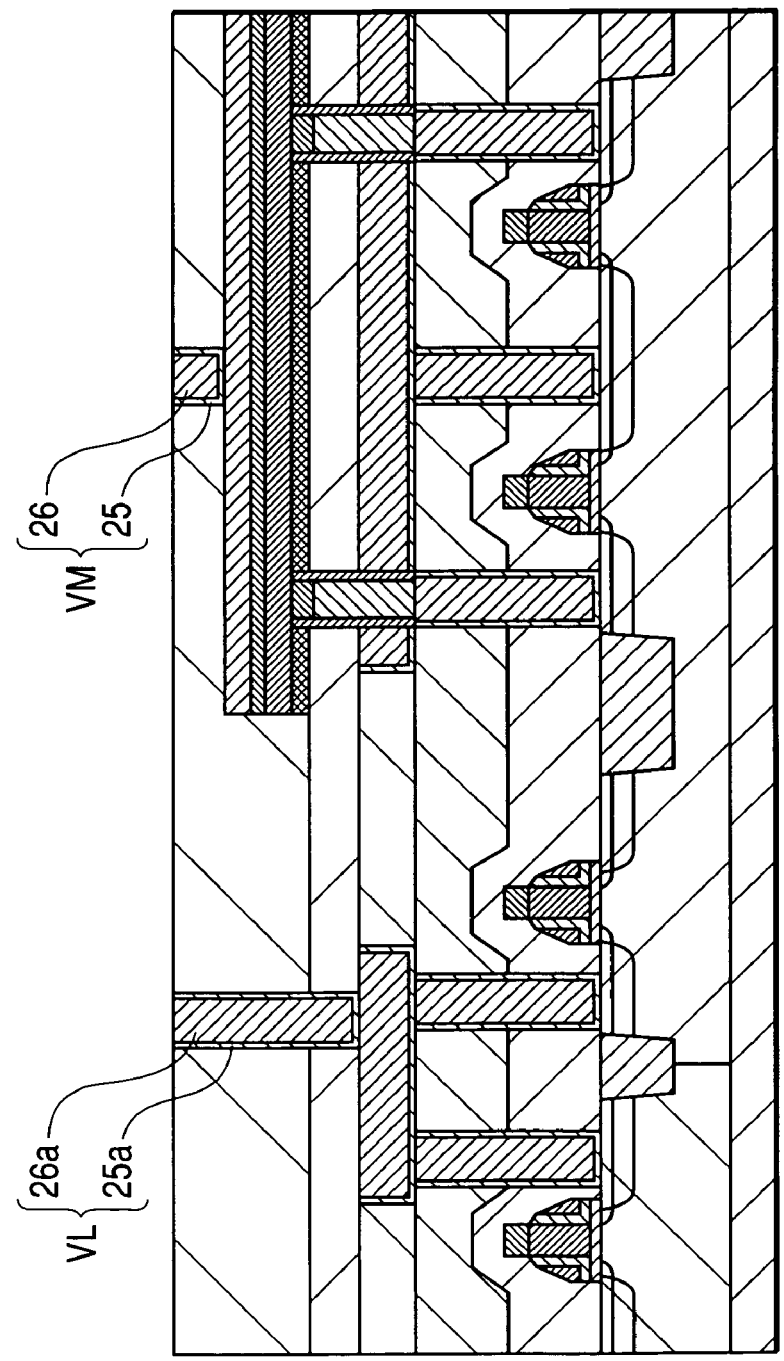
FIG. 16 is still another sectional view of the principal parts of the substrate of the semiconductor integrated circuit device shown in FIG. 1 during the fabrication process.

Subsequently, by the lithographic and dry etching processes, the contact hole is bored in the inter-level insulation film 11e of the memory cell area mmry, and in the inter-level insulation film 11e of the logic circuit area lgc, respectively, and the barrier metal film 25 and tungsten film 26 are deposited in that order. These contact hole are filled up and etch back is applied until the upper surface of the inter-level insulation film 11e is exposed and the respective upper surfaces of the tungsten films 26, 25a in the contact holes are flush with the upper surface of the inter-level insulation film 11e, thereby completely isolating an electrode contact in the via VM in the memory cell area from an electrode contact in the via VL in the logic circuit area, whereupon a structure as shown in FIG. 16 is formed.

Figure 17:
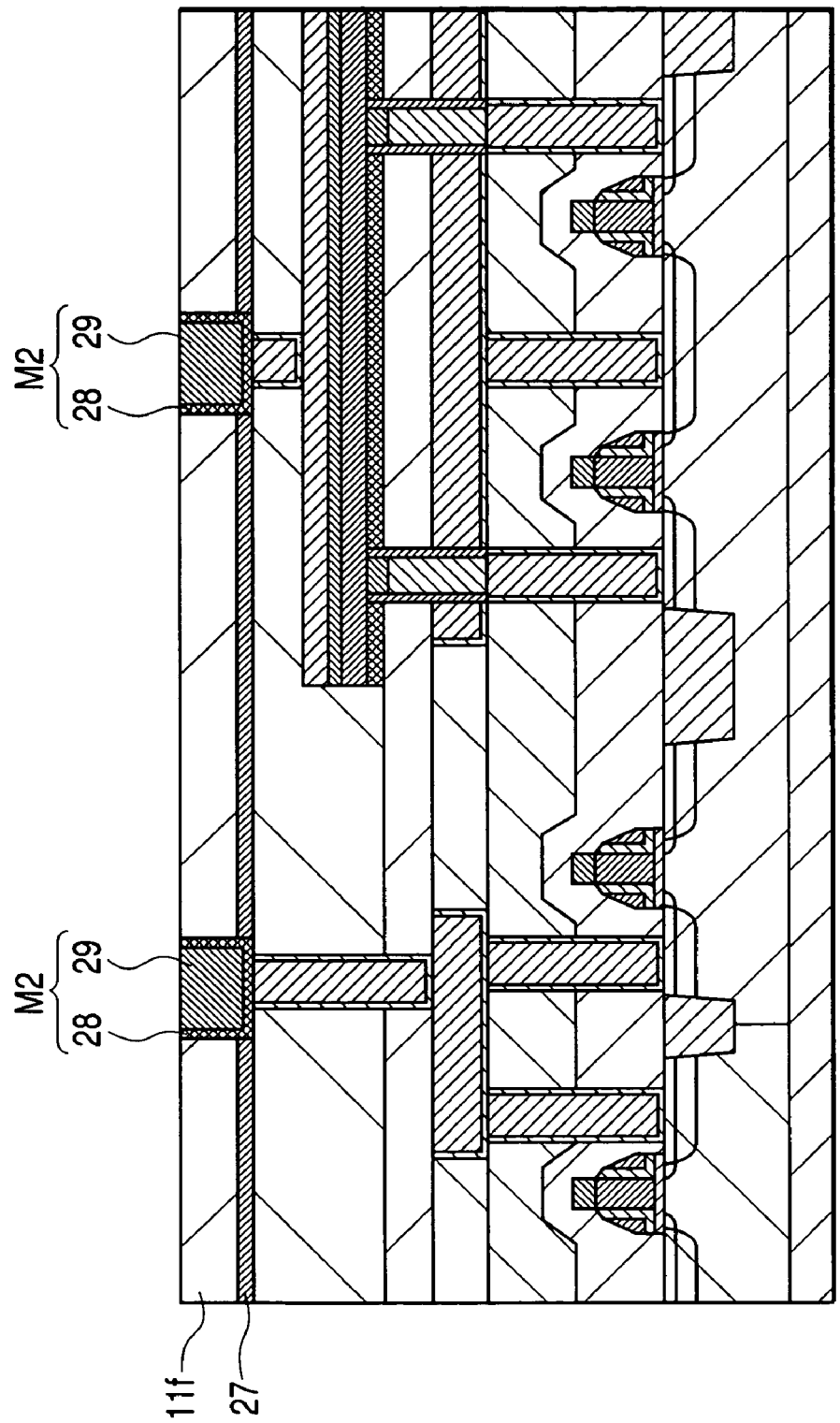
FIG. 17 is another sectional view of the principal parts of Embodiment 1 of the semiconductor integrated circuit device according to the invention.

Thereafter, a copper interconnect barrier film 27 and the inter-level insulation film 11f are deposited on the surface, interconnect grooves are cut in the inter-level insulation film 11f by the lithographic and dry etching processes, a copper interconnect 29 and copper interconnect metal barrier film 29 are deposited in that order, the interconnect grooves are filled up, and etch back is applied until the upper surface of the inter-level insulation film 11f is exposed and the upper surface of the metal interconnect in the interconnect grooves is flush with the upper surface of the inter-level insulation film 11f, thereby forming the second layer interconnect M2, whereupon a structure as shown in FIG. 17 is formed.

In the upper part of the second layer interconnect M2, a plurality of interconnect layers are formed by use of the public known method, however, those interconnect layers are not shown in the figure.

Further, by use of the public known method, hydrogen annealing at a temperature on the order of 400 to 450° C. is applied before completion of the semiconductor integrated circuit device.

Figure 18:
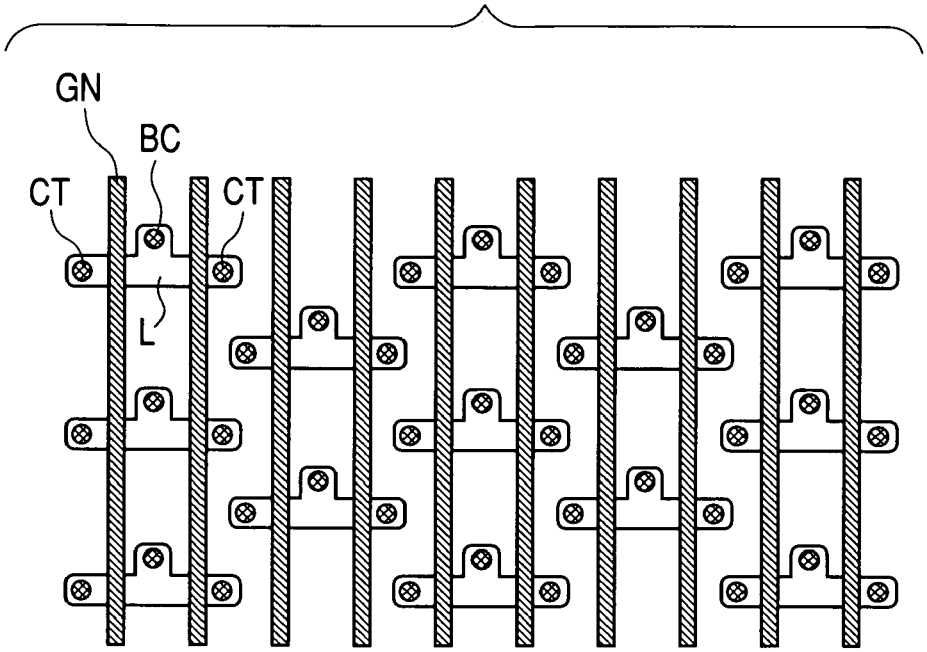
FIG. 18 is still another layout view of the principal parts of Embodiment 1 of the semiconductor integrated circuit device according to the invention.

Further, with the present embodiment, as shown in FIG. 2, the element active areas are of a straight line type in shape, and the bit line contact electrodes BC are formed so as to be protruded along the longitudinal direction of the element active areas, however, as shown in FIG. 18, the element active areas may be of a protruded type in shape.

Figure 19:
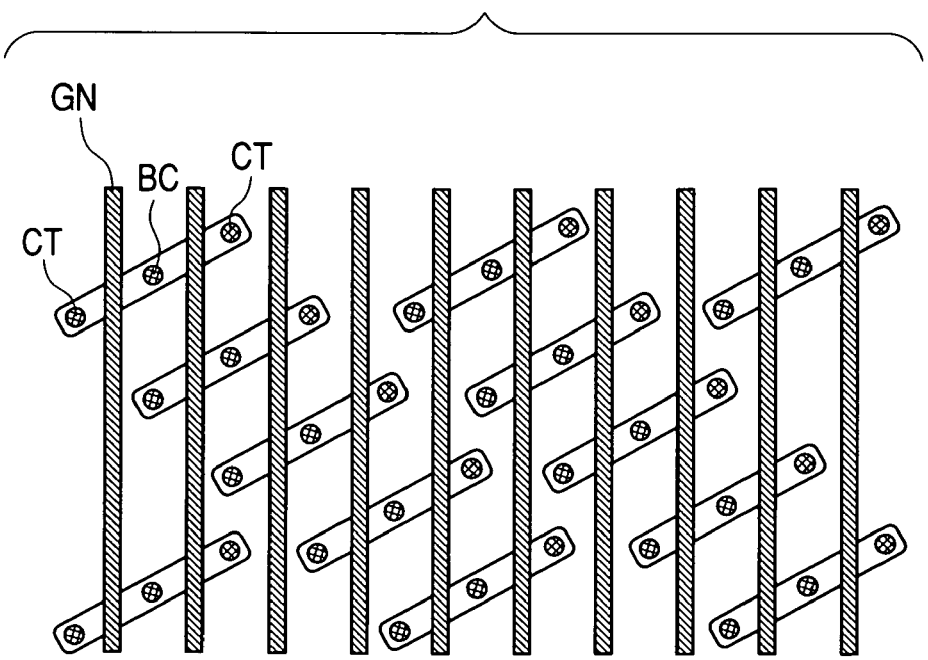
FIG. 19 is a further layout view of the principal parts of Embodiment 1 of the semiconductor integrated circuit device according to the invention.
Figure 20:
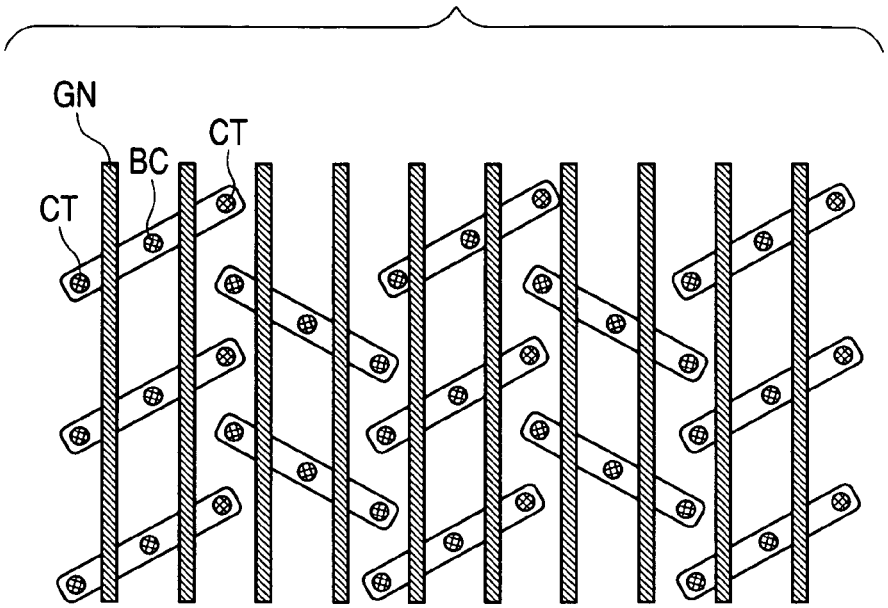
FIG. 20 is a still further layout view of the principal parts of Embodiment 1 of the semiconductor integrated circuit device according to the invention.
Figure 47:
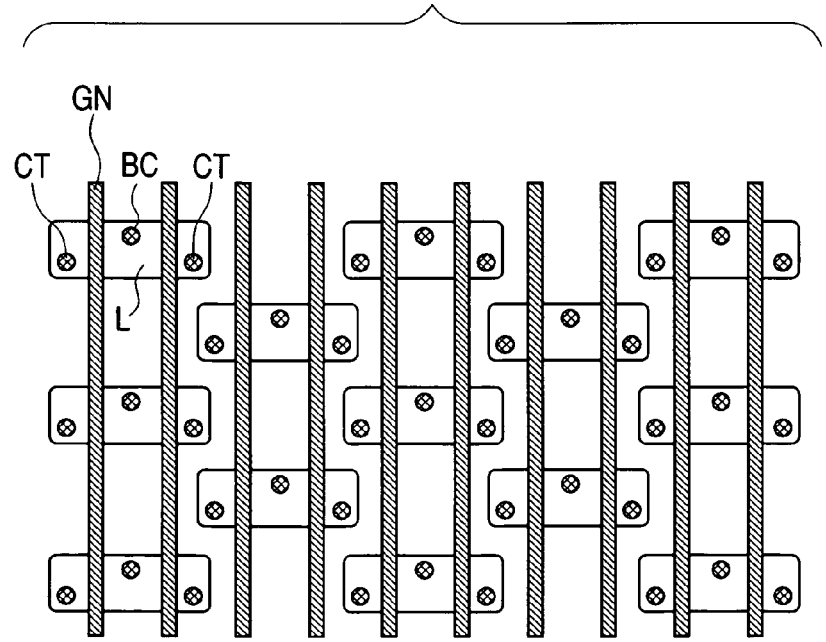
FIG. 47 is another layout view of the principal parts of Embodiment 3 of the semiconductor integrated circuit device according to the invention.

Furthermore, as shown in FIGS. 19 and 20, the element active areas may be of an oblique type in shape, against the respective bit lines. Still further, the element active areas may be of a straight line type in shape as shown in FIG. 47.

Yet further, with the present embodiment, as shown in FIG. 3, a folded-bit-line-layout, or a so-called two-intersecting point layout is adopted whereby the memory cell elements are arranged so as to be disposed in the direction of the word lines at a frequency of once every two cycles of bit line cycles. The layout is advantageous in that the memory cell elements in close proximity to each other are not selected so as to use the same word line, so that mutual action between the memory cells in close proximity to each other can be suppressed.

Figure 21:
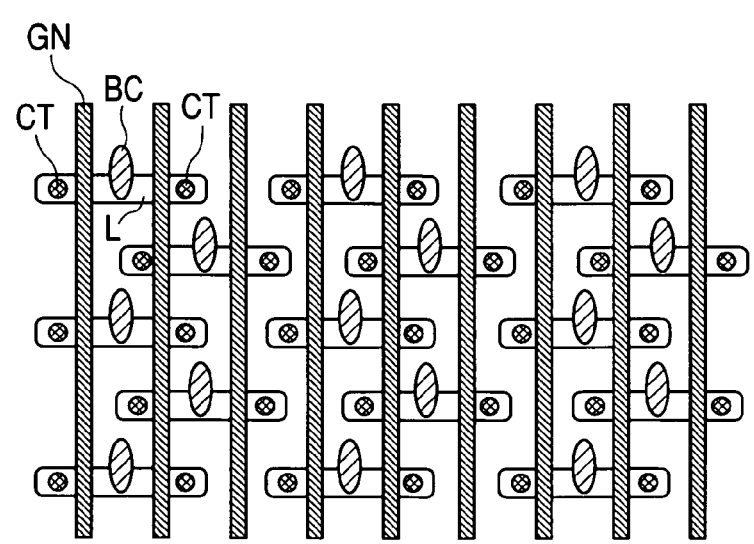
FIG. 21 is a yet further layout view of the principal parts of Embodiment 1 of the semiconductor integrated circuit device according to the invention.
Figure 22:
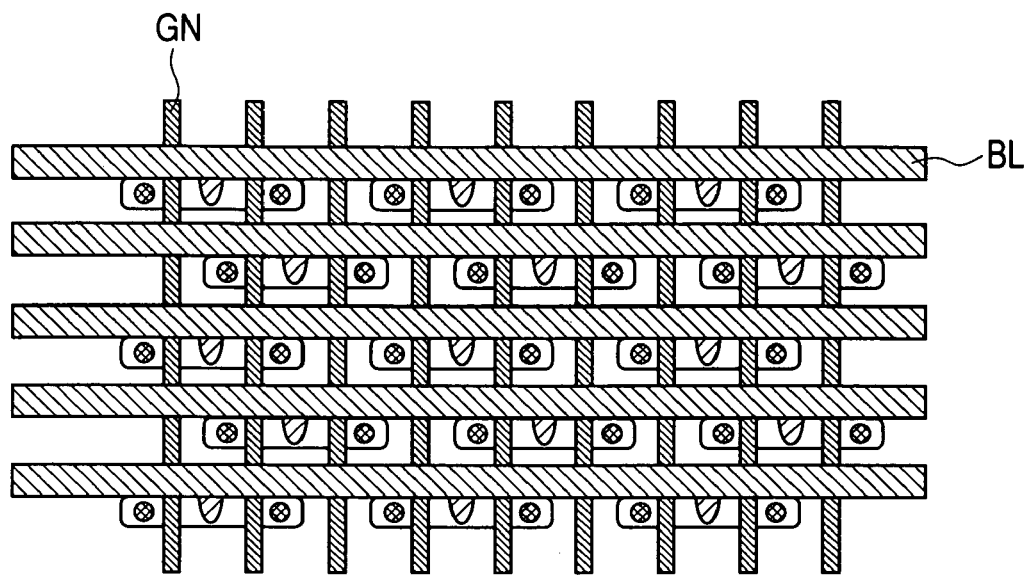
FIG. 22 is another layout view of the principal parts of Embodiment 1 of the semiconductor integrated circuit device according to the invention.

Further, as shown FIGS. 21, and 22, an open-bit-line-layout, or a so-called one-intersecting point layout may be adopted whereby the memory cell elements are arranged so as to be disposed in the direction of the word line at a frequency of once every cycle of the bit line cycles. The layout is advantageous in that the memory cells can be highly integrated.

Figure 23:
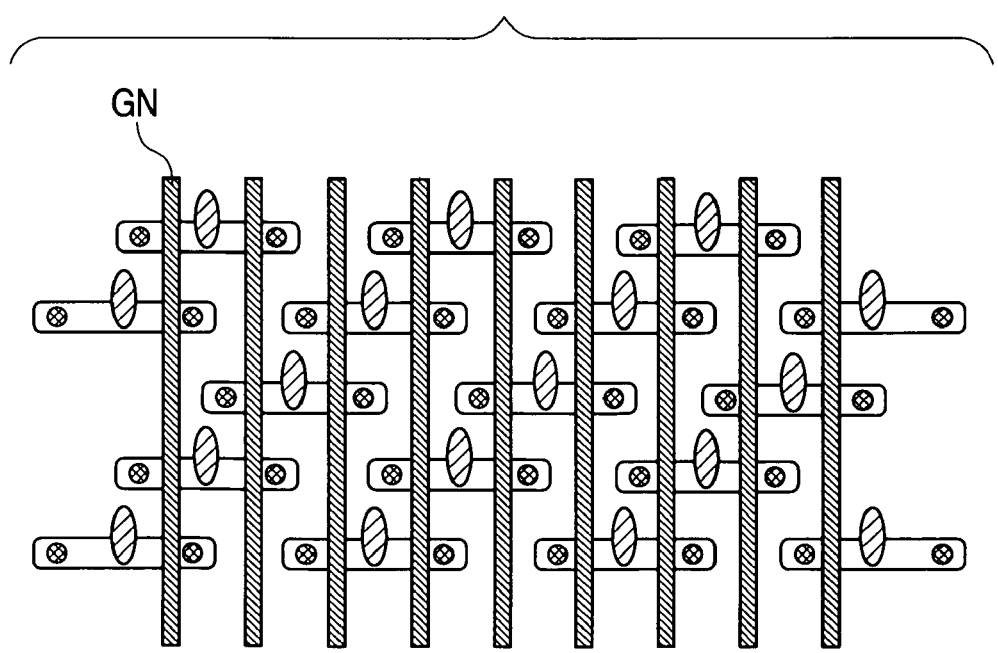
FIG. 23 is still another layout view of the principal parts of Embodiment 1 of the semiconductor integrated circuit device according to the invention.
Figure 24:
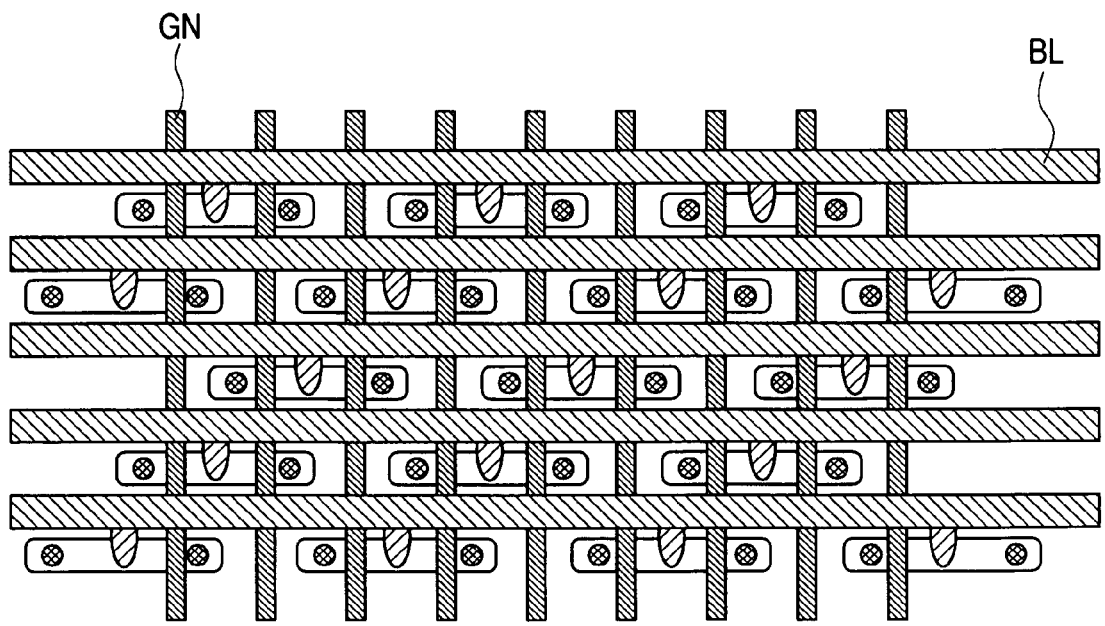
FIG. 24 is a further layout view of the principal parts of Embodiment 1 of the semiconductor integrated circuit device according to the invention.

Still further, as shown FIGS. 23, and 24, an open-bit-line-layout, or a so-called 1.5 intersecting point layout may be adopted whereby the memory cell elements are arranged so as to be disposed in the direction of the word line at a frequency of twice every three cycles of the bit line cycles.

Figure 27:
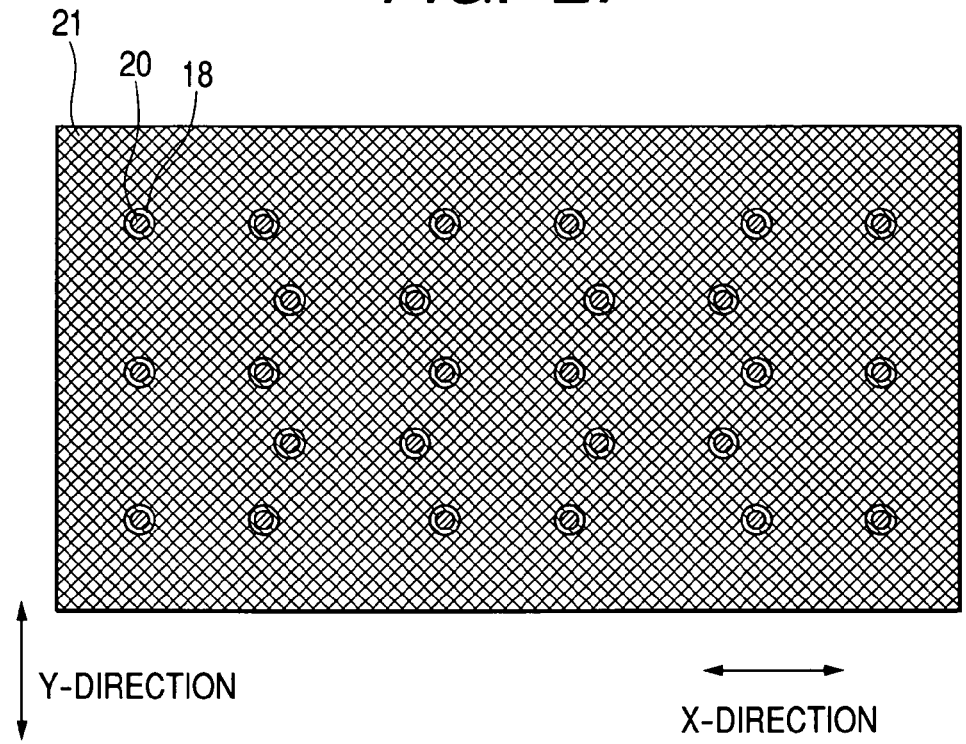
FIG. 27 is another layout view of the principal parts of Embodiment 1 of the semiconductor integrated circuit device according to the invention.

With Embodiment 1, the phase change material layer is for common use, and an interface between the upper part of the memory cell lower contact electrode TP and the phase-shift-material-peel-preventive film 21 is as shown in FIG. 27.

Figure 39:
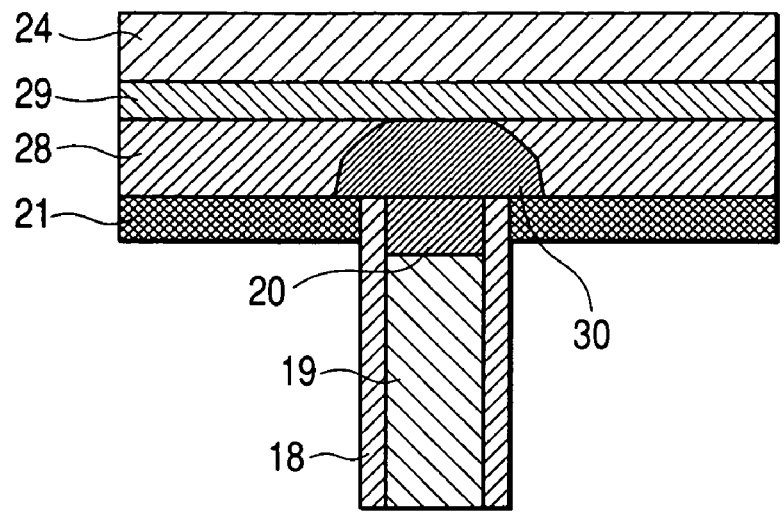
FIG. 39 is a sectional view showing the principal parts of the semiconductor integrated circuit device, for describing an advantageous effect of the invention.
Figure 40:
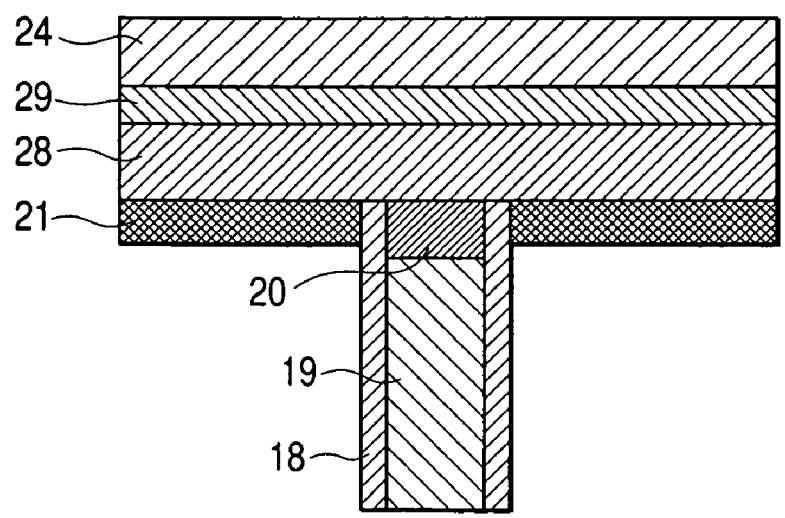
FIG. 40 is another sectional view showing the principal parts of the semiconductor integrated circuit device, for describing the advantageous effect of the invention.

With the memory cell element in the high resistance state ("1" state), a phase change material turns into an amorphous sate in such a way as to cover the upper surface of each of the memory cell lower contact electrodes as shown in FIG. 39. In contrast, with the memory cell element in the low resistance state ("0" state), the phase change material in its entirety turns into a crystallized state as shown in FIG. 40.

Figure 41:
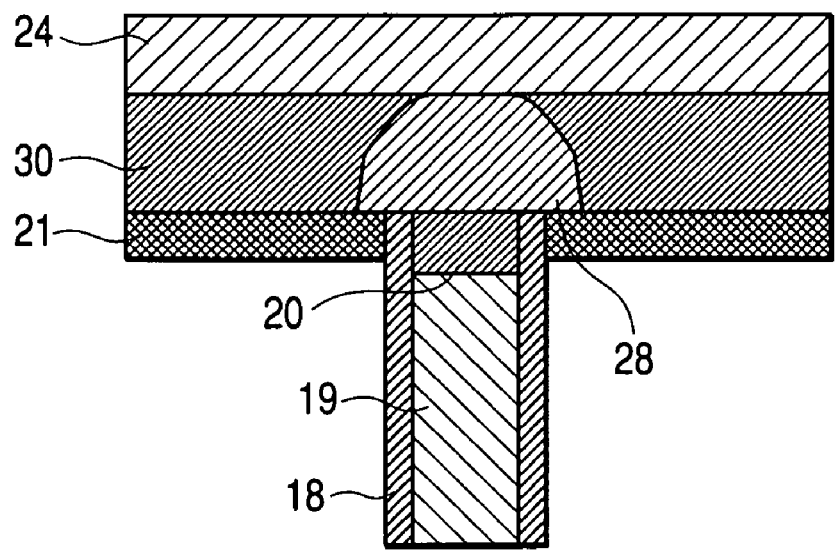
FIG. 41 is still another sectional view showing the principal parts of the semiconductor integrated circuit device, for describing the advantageous effect of the invention.

Further, with the memory cell element in the high resistance state ("1" state), the phase change material in its entirety may be in an amorphous sate as shown in FIG. 41. In contrast, with the memory cell element in the low resistance state ("0" state), the phase change material turns into a crystallized state in such a way as to cover the upper surface of each of the memory cell lower contact electrodes TP as shown in FIG. 42.

Figure 42:
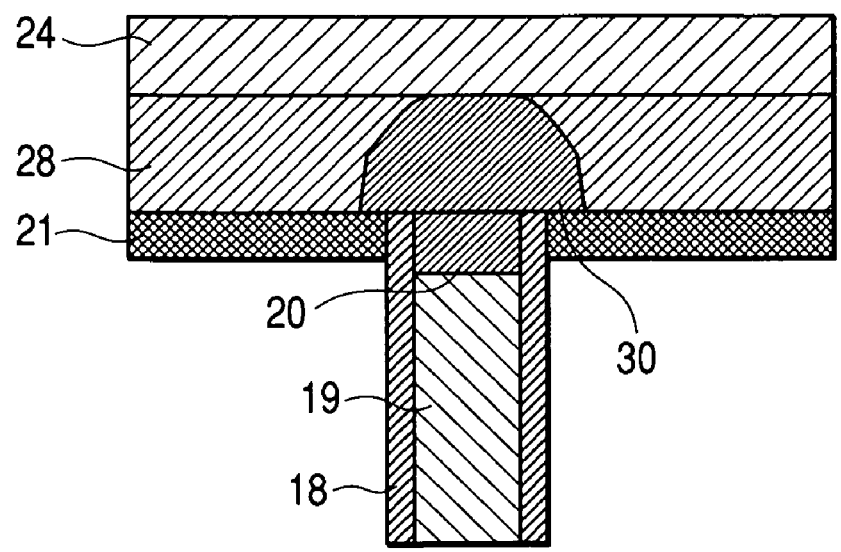
FIG. 42 is a further sectional view showing the principal parts of the semiconductor integrated circuit device, for describing the advantageous effect of the invention.

In this connection, in FIGS. 41 and 42, the phase change material layer is assumed to be a single layer, but the same may be a stacked layer.

Thus, with the present embodiment, the phase change material layer is for common use in the memory cell area where the memory cell elements are disposed so as to be integrated. As a result, electrical characteristics of the memory cell elements become uniform, thereby enabling reliability to be enhanced.

The reason why such an advantageous effect can be obtained is described in detail hereinafter.

Figure 48:
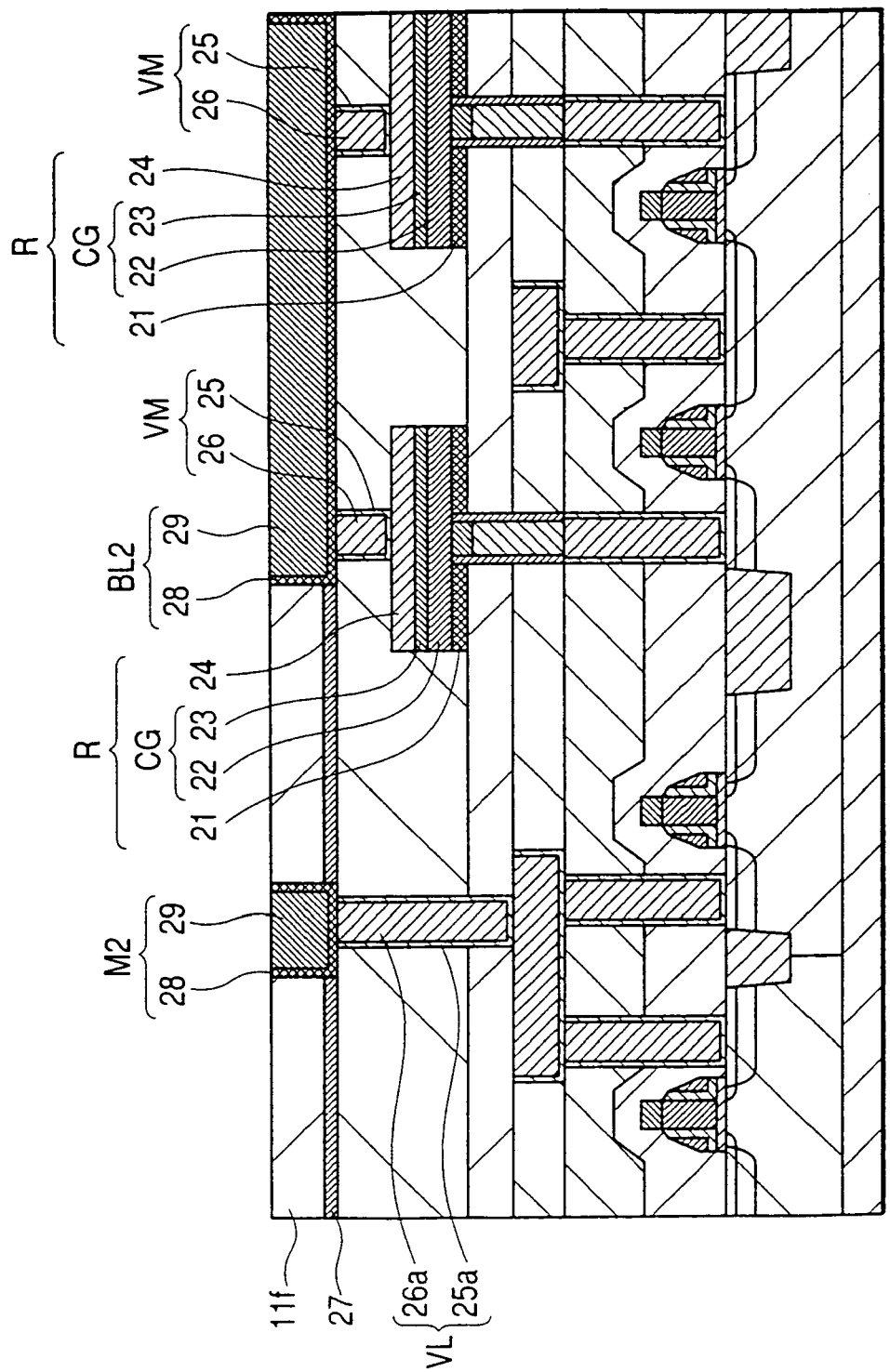
FIG. 48 is a sectional view of the principal parts of a conventional semiconductor integrated circuit device.

An assumption is made that a sectional view of the principal parts of a semiconductor integrated circuit device is, for example, as shown in FIG. 48. With the semiconductor integrated circuit device in FIG. 48, the bit lines BL2 are disposed above phase change material layers. In the case of this example, the sidewalls of the respective phase change material layers are disposed so as to be exposed for every memory cell element. Accordingly, an effect of etching on the shape of the memory cell elements and variation in the composition thereof results.

With the present embodiment, however, since no sidewall interface of the phase change material layer exists except for the memory cell elements positioned at the outermost peripheral parts of the memory cell area, the effect of etching on the shapes of the memory cell elements and variation in the composition thereof is eliminated.

That is, the reason for obtaining the advantageous effect is that the sidewall interface of the phase change material layer except for the memory cell elements positioned at the outermost peripheral parts of the memory cell area can be eliminated and the effect of the etching on the shapes of the memory cell elements and variation in the composition thereof is eliminated.

Further, with the present embodiment, the phase change material layer is a stacked layer made up of the phase change recording material films differing in property from each other, particularly, a stacked layer of high-melting phase change recording material film and low-melting phase change recording material film. As a result, the electrical characteristics of the memory cell elements become uniform, thereby enabling reliability thereof to be enhanced.

The reason for obtaining the advantageous effect described is described in further detail hereinafter. If the phase change recording material film in contact with the memory cell upper plate electrode has a melting point higher than that for the other phase change recording material film formed underneath the phase change recording material film, an amorphous layer can cause phase change to occur such that a phase change area of the phase change material layer is reduced in shape, particularly, along a direction in which the phase change recording material films are stacked. For example, as shown in FIG. 39, it is possible to prevent the amorphous layer formed from the memory cell lower contact electrode from coming in contact with the memory cell upper plate electrode. As a result, mutual diffusion of metallic substances between the phase change material layer and the memory cell upper plate electrode can be prevented, so that it has become possible to ensure uniformity in the electrical characteristics of the memory cell elements, thereby enabling reliability thereof to be enhanced.

Further, with the present embodiment, the high resistive conductive material is disposed only in the upper part of each of the memory cell lower contact electrodes connecting the phase change material layer to the metal contact electrodes connected with the respective active areas on the semiconductor substrate, for the MISFETs. As a result, the upper part of each of the memory cell lower contact electrodes can serve as a heater generating Joule heat, so that refresh speed of the respective memory cell elements can be enhanced.

The reason why such an advantageous effect can be obtained is described in detail hereinafter. If the high resistive conductive material is not disposed in the upper part of each of the memory cell lower contact electrodes, heat is prone to escape from the phase change material layer to the memory cell lower contact electrodes when heating the phase change material layer by use of electric pulses. For this reason, temperature at portions of the phase change material layer, in close proximity to the respective memory cell lower contact electrodes, drops, so that it is not possible to cause phase change to occur such that the phase change area of the phase change material layer changes in shape, particularly, areas thereof, in close proximity to the respective memory cell lower contact electrodes, change in shape so as to completely cover the upper surface of each of the memory cell lower contact electrodes as shown in FIG. 40. However, if the high resistive conductive material is disposed only in the upper part of each of the memory cell lower contact electrodes, the high resistive conductive material generates Joule heat, so that heat to the memory cell lower contact electrodes is less conducted, thereby checking a drop in temperature at the portions of the phase change material layer, in close proximity to the respective memory cell lower contact electrodes. As a result, within short time, the phase change material can completely cover the upper surface of each of the memory cell lower contact electrodes, particularly in the phase change area in close proximity to a contact part between the memory cell lower contact electrodes and the phase change material layer, as shown in FIG. 39.

Furthermore, if the high resistive conductive material is disposed throughout each of the memory cell lower contact electrodes, a resistance value of each of the memory cell lower contact electrodes becomes high, thereby creating a cause for deterioration in operating characteristics of the memory. On the other hand, if the high resistive conductive material is disposed only in the upper part of each of the memory cell lower contact electrodes, the resistance value thereof hardly changes.

Further, with the present embodiment, the phase change material layer is provided for common use in the memory cell area where the memory cell elements are disposed so as to be integrated, and further, the common upper metal electrode connected to a power source line is formed only in the upper layer of the phase change material layer. As a result, electrical characteristics of the memory cell elements become uniform, thereby enabling reliability thereof to be enhanced.

Figure 43:
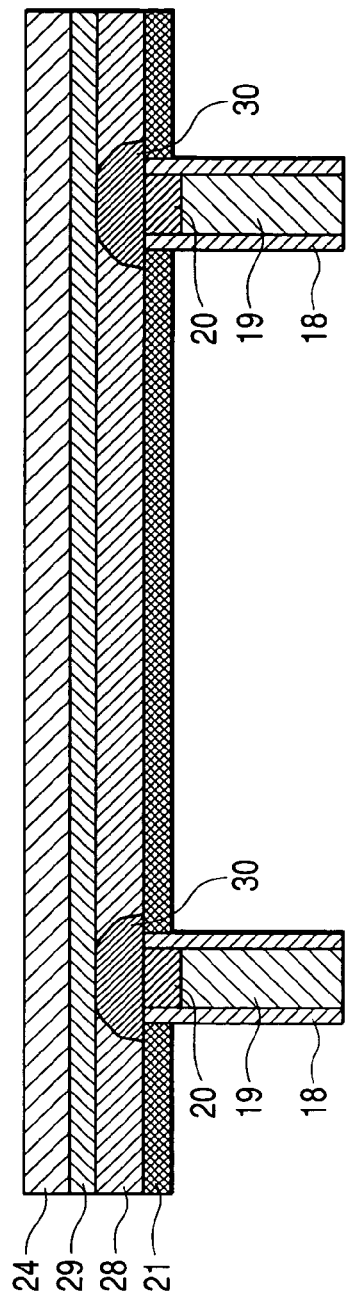
FIG. 43 is a still further sectional view showing the principal parts of the semiconductor integrated circuit device, for describing the advantageous effect of the invention.

The reason for obtaining such an advantageous effect is described in detail hereinafter. If the common upper metal electrode 24 is formed only in the upper layer of the phase change material layer, electric fields in the lateral direction in FIG. 43 can be checked, so that an interaction between the phase change memories adjacent to each other can be checked, thereby enabling uniformity of electrical characteristics of the memory cell elements to be ensured and reliability thereof to be enhanced.

Figure 44:
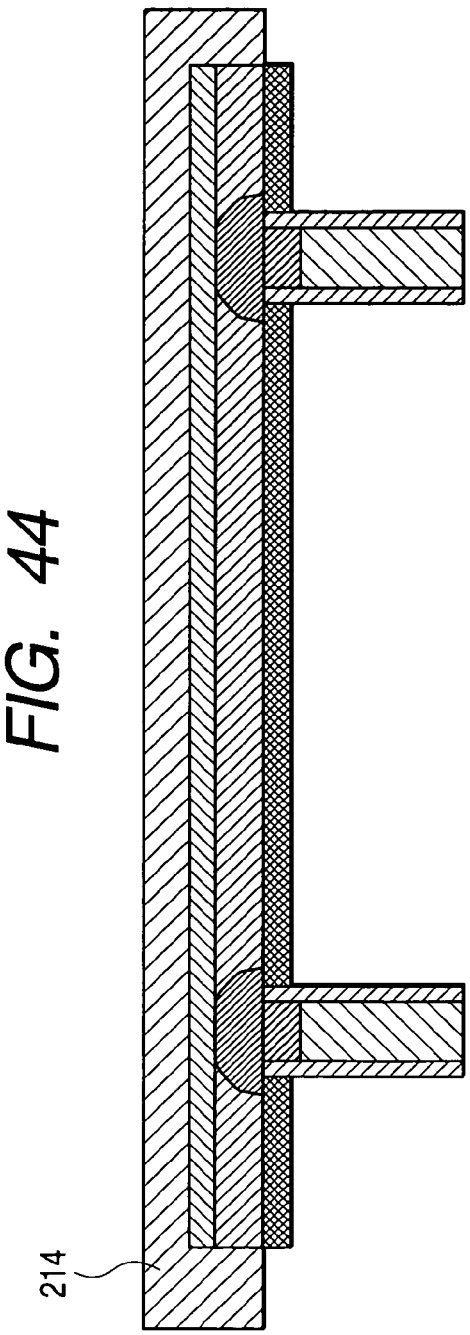
FIG. 44 is a yet further sectional view showing the principal parts of the semiconductor integrated circuit device, for describing the advantageous effect of the invention.

However, if an electrode 31 is formed at sidewalls of the phase change material layer, respectively, as shown in FIG. 44, electric fields in the lateral direction in FIG. 44 are generated as main constituents, thereby raising a possibility of an interaction occurring between the phase change memories adjacent to each other.

Further, with the present embodiment, a contact electrode connecting the phase change material layer with the diffusion layer of the MISFET is a two-stage contact electrode. As a result, while optimizing the structure of the memory cell lower contact electrode, that is, the upper stage of the two-stage plug electrode, for enhancement of the characteristics of the phase change memory, the metal contact electrode, that is, the lower stage of the two-stage plug electrode, along with the bit line contact electrodes and the MISFETs in the logic circuit area, are formed by a concurrent process, thereby enabling low cost to be achieved.

Still further, with the present embodiment, the bit lines are disposed under the phase change material layer. As a result, uniformity in the electrical characteristics of the memory cell elements is achieved, thereby enabling reliability thereof to be enhanced.

The reason for obtaining such an advantageous effect is described in detail hereinafter. When the bit lines are disposed under the phase change material layer, the bit line contact electrode is disposed between the respective bit lines and the semiconductor area DNC of the respective MISFETs for selection of the memory cell. That is, the bit line contact electrode neither penetrates through the phase change material layer, nor is disposed within the phase change material layer. As a result, the side walls of the phase change material layer are prevented from exposure due to penetration by bit line plugs, so that uniformity in the electrical characteristics of the memory cell elements is achieved, thereby enabling reliability thereof to be enhanced.

Further, with the present embodiment, the hydrogen annealing at a temperature in a range of about 400 to 450° C. is applied by use of the public known method. Accordingly, the phase change material layer of the semiconductor integrated circuit device as completed, in the initial condition, is crystallized. By use of the phase change material layer in a crystallized condition, portions of the phase change material layer, in close proximity to the lower electrodes, are turned amorphous, thereby enabling the phase change memory cell to be operated.

<Embodiment 2>

The present embodiment relates to a structure wherein phase change material layers which chalcogenide layers and plate electrodes are separated from each other are disposed above bit lines.

A method of fabricating a semiconductor integrated circuit device according to Embodiment 2 up to depositing a phase-shift-material-peel-preventive film 21, phase change recording material film 22, phase change recording material film 23, and tungsten film 24 is the same as the method of fabricating the semiconductor integrated circuit device according to Embodiment 1 up to depositing the phase-shift-material-peel-preventive film 21 made of silicon nitride, phase change recording material film 22, phase change recording material film 23, and memory cell upper plate electrode 24 made of tungsten, omitting therefore description thereof.

Figure 25:
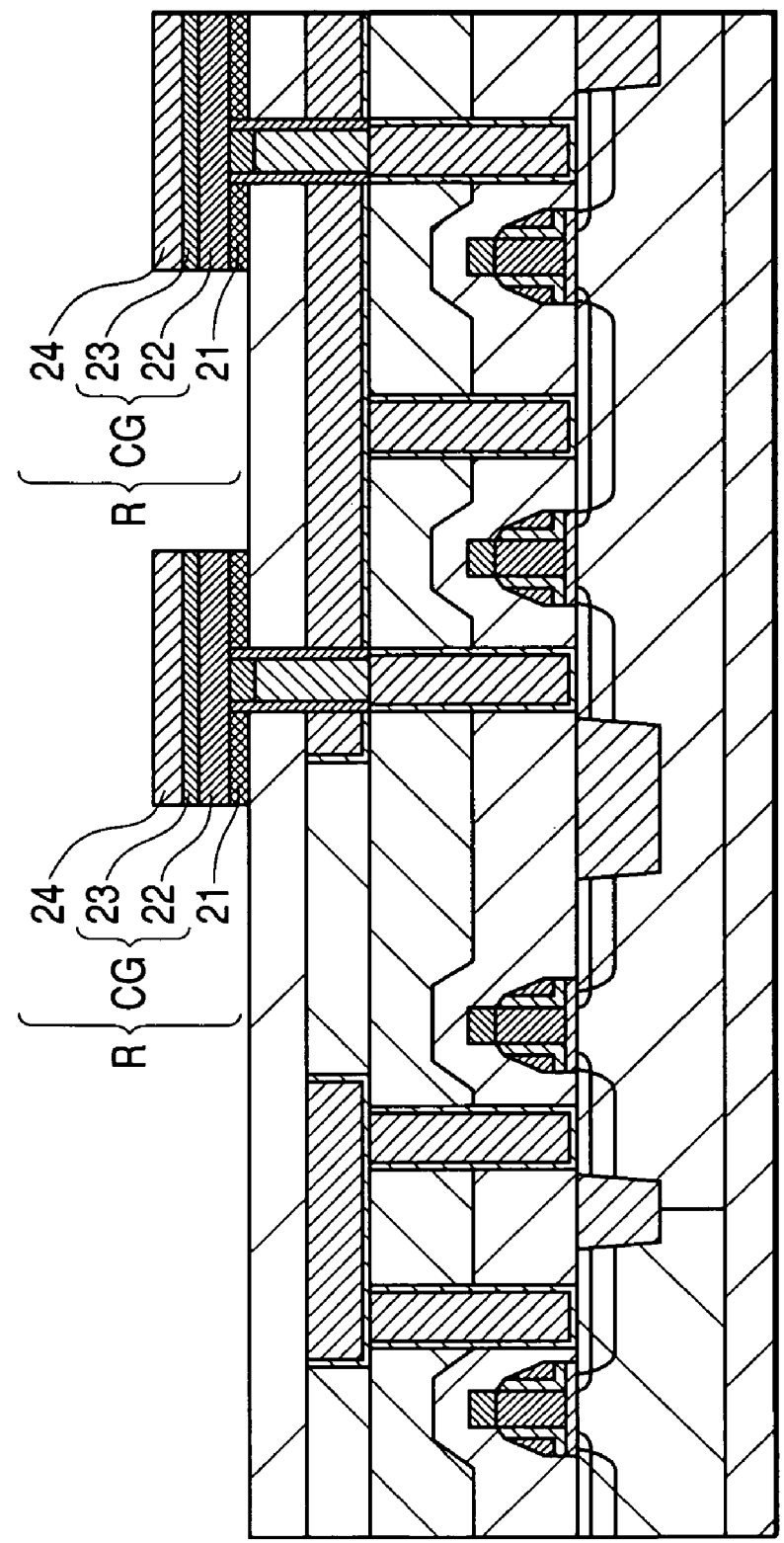
FIG. 25 is a sectional view of the principal parts of a substrate of Embodiment 2 of a semiconductor integrated circuit device according to the invention during a fabrication process.

With the present embodiment, the phase-shift-material-peel-preventive film 21, phase change recording material film 22, phase change recording material film 23, and tungsten film 24 are subsequently worked into resistor elements R, whereupon a structure as shown in FIG. 25 is formed.

Figure 26:
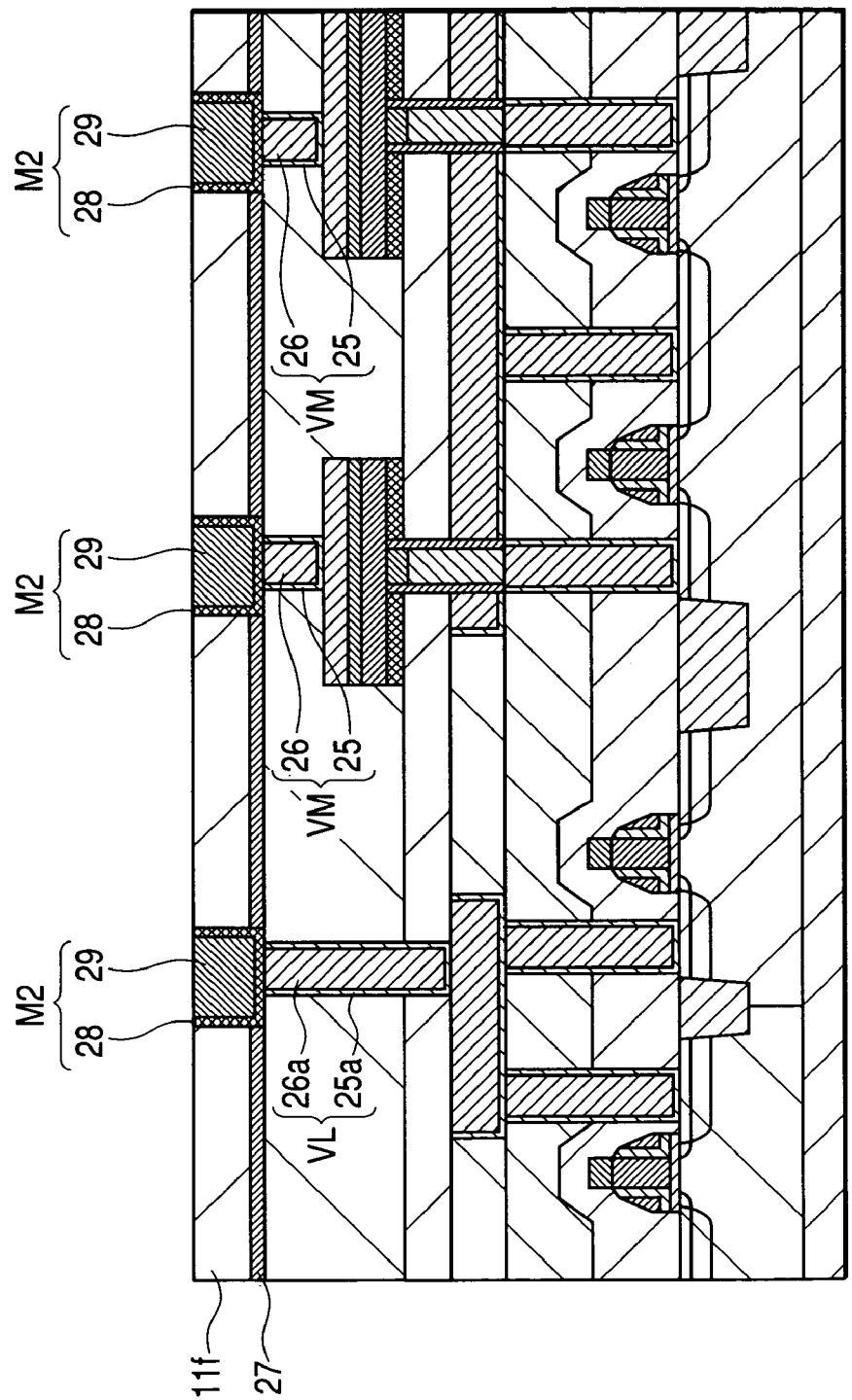
FIG. 26 is a sectional view of the principal parts of Embodiment 2 of the semiconductor integrated circuit device according to the invention.

A fabricating method thereafter is the same as that according to Embodiment 1, and a structure after the formation of a second layer interconnect is as shown in FIG. 26.

Figure 28:
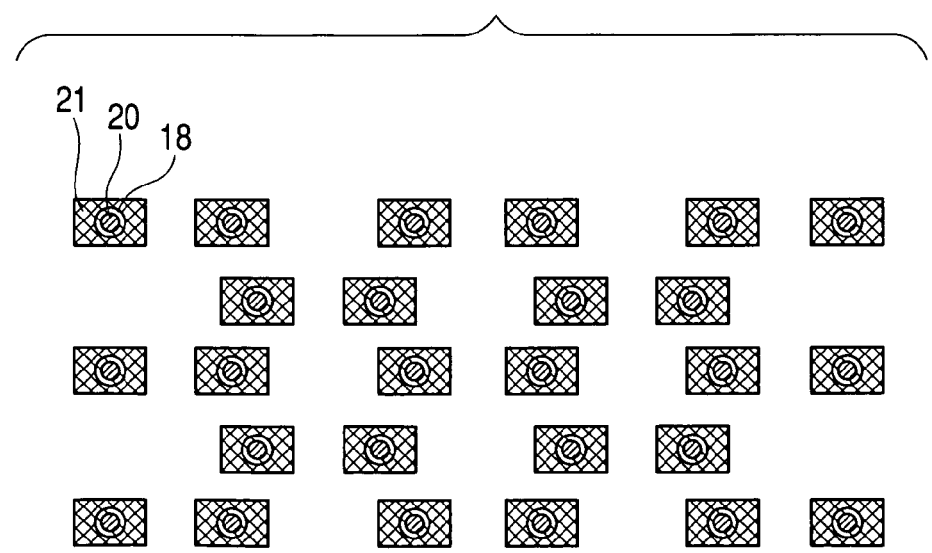
FIG. 28 is a layout view of the principal parts of Embodiment 2 of the semiconductor integrated circuit device according to the invention.

With the present embodiment, the resistor elements R are separated from each other by the memory cell element as shown in FIG. 28. Since the bit lines BL are disposed under the phase change material layer, the memory cell elements can be disposed without being affected by disposition of the bit lines and bit line plugs, so that high integration of a memory cell can be achieved by suppressing area penalty for the sake of uniformity in the electrical characteristics of the memory cell elements, and enhancement in reliability of the memory cell elements.

Figure 29:
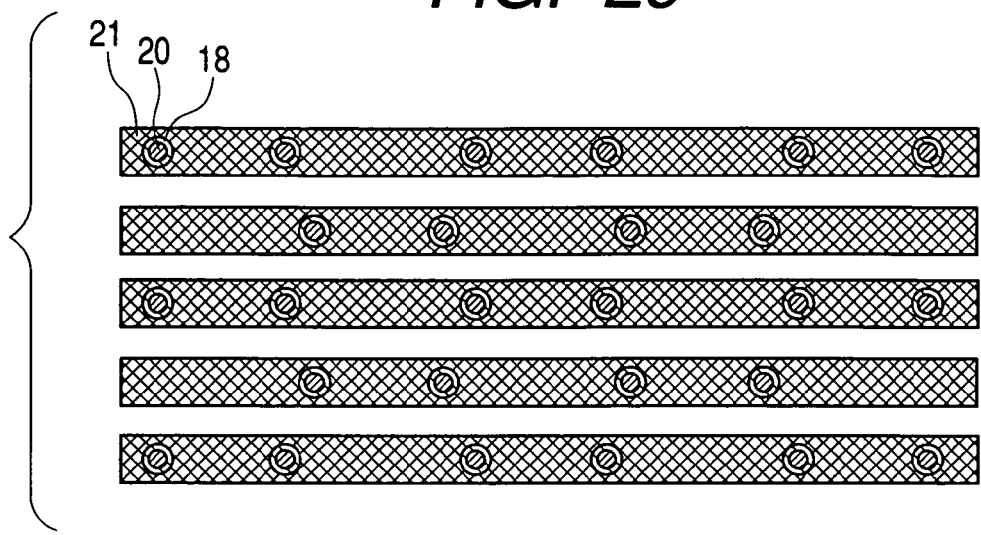
FIG. 29 is another layout view of the principal parts of Embodiment 2 of the semiconductor integrated circuit device according to the invention.

Further, with the present embodiment, the phase change material layers are separated from each other by the memory cell element, however, as shown in FIG. 29, the phase change material layers may be separated from each other by the bit line cycle. This shape can be rendered to be an optional shape without area penalty due to the effects of through-holes for bit line contact electrodes.

Figure 30:
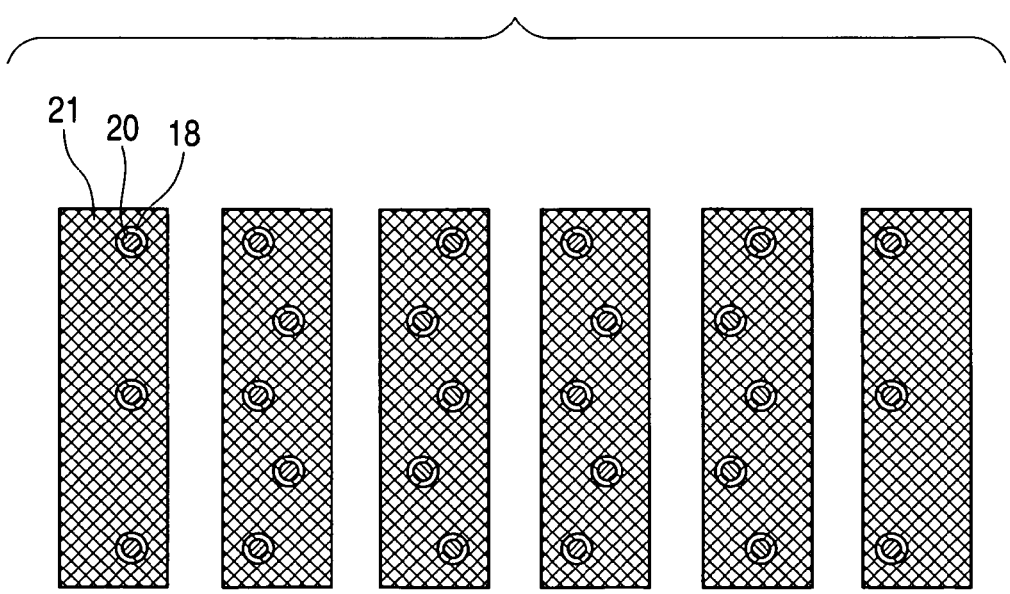
FIG. 30 is still another layout view of the principal parts of Embodiment 2 of the semiconductor integrated circuit device according to the invention.

Still further, as shown in FIG. 30, the phase change material layers may be separated from each other by the word line cycle. This shape can be rendered to be an optional shape without the area penalty due to the effects of the through-holes for the bit line contact electrodes.

Figure 31:
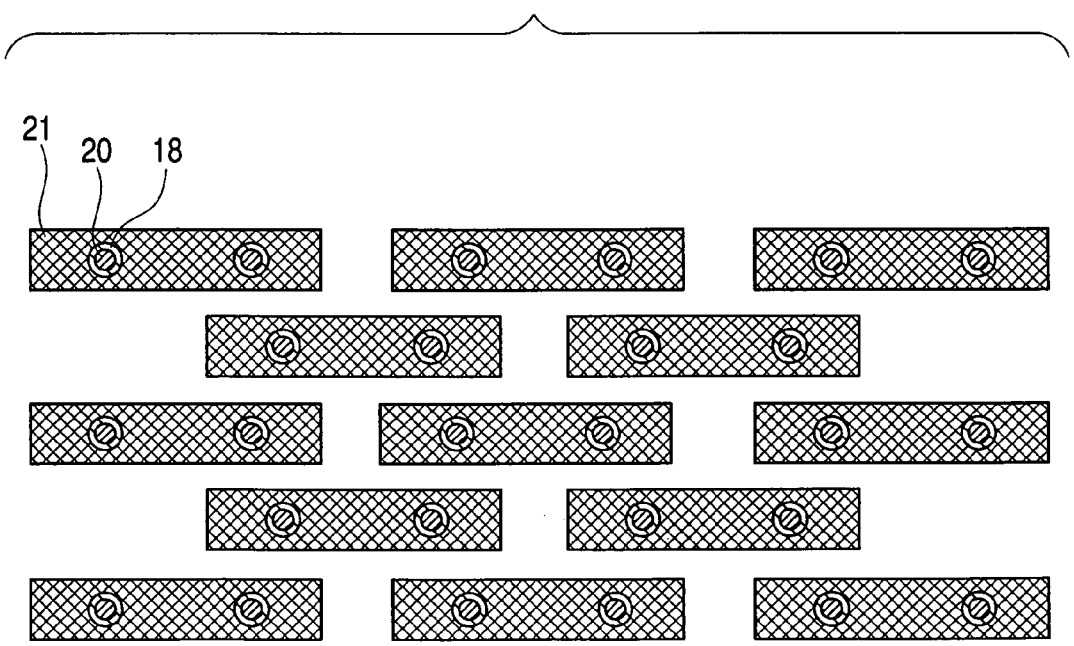
FIG. 31 is a further layout view of the principal parts of Embodiment 2 of the semiconductor integrated circuit device according to the invention.

Yet further, as shown in FIG. 31, the phase change material layers may be separated from each other by the element active area cycle. This shape can be rendered to be an optional shape without the area penalty due to the effects of the through-holes for the bit line contact electrodes.

Figure 45:
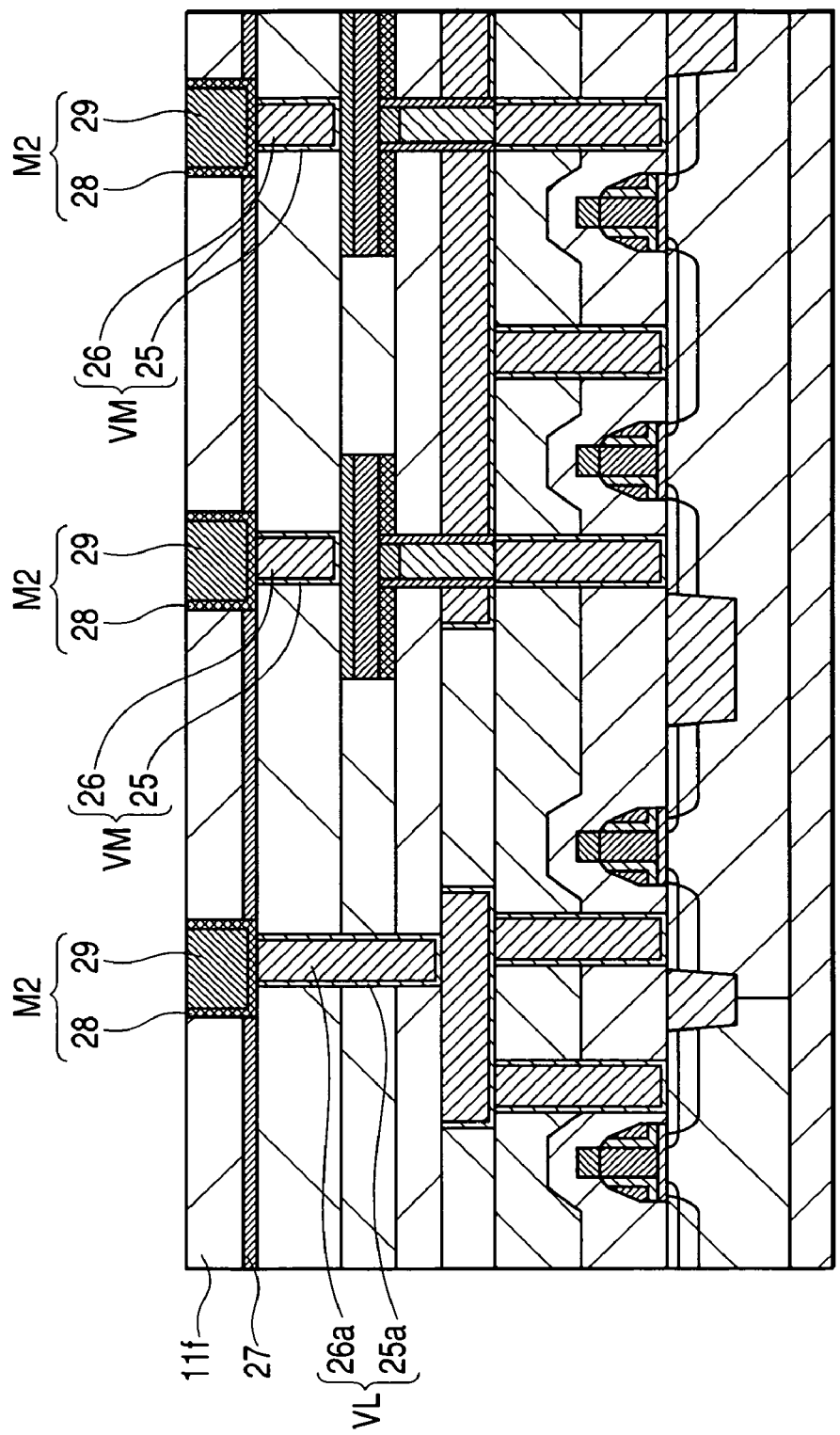
FIG. 45 is a sectional view of the principal parts of another substrate of Embodiment 2 of the semiconductor integrated circuit device according to the invention.

Further, with the present embodiment, the memory cell upper plate electrodes are disposed on top of the phase change material layers, respectively, however, as shown in FIG. 45, a structure may be adopted wherein the second layer interconnect is disposed by connecting the phase change materials with vias VM in a memory cell area, respectively. With the use of copper. wiring for the second layer interconnect, the upper plate electrodes can be rendered lower in resistance.

<Embodiment 3>

The present embodiment relates to a structure wherein a common plate electrode is disposed in the upper part of a phase change material layers which chalcogenide layers are separated from each other.

A method of fabricating a semiconductor integrated circuit device according to Embodiment 3, up to the steps of depositing a high resistive metal film 20, made up of, for example, a titanium film and titanium nitride film, in that order from a lower layer, by the sputtering process and so forth, to be embedded in respective contact holes, etching back the high resistive metal film 20 until the upper surface of a phase-shift-material-peel-preventive film 21 is exposed, and the upper surface of each of memory cell lower contact electrodes TP in the respective contact holes is flush with that of the phase-shift-material-peel-preventive film 21, and completely isolating the respective memory cell lower contact electrodes TP from each other is the same as the fabricating method according to Embodiment 1, comprising the steps of depositing the high resistive metal film 20, made up of the titanium film and titanium nitride film, in that order from the lower layer, by the sputtering process and so forth, to be embedded in the respective contact holes, etching back the high resistive metal film 20 until the upper surface of the phase-shift-material-peel-preventive film 21 is exposed, and the upper surface of each of the memory cell lower contact electrodes TP in the respective contact holes is flush with that of the phase-shift-material-peel-preventive film 21, and completely isolating the respective memory cell lower contact electrodes TP from each other, as shown in FIGS. 4 through 12, omitting therefore description thereof.

Figure 32:
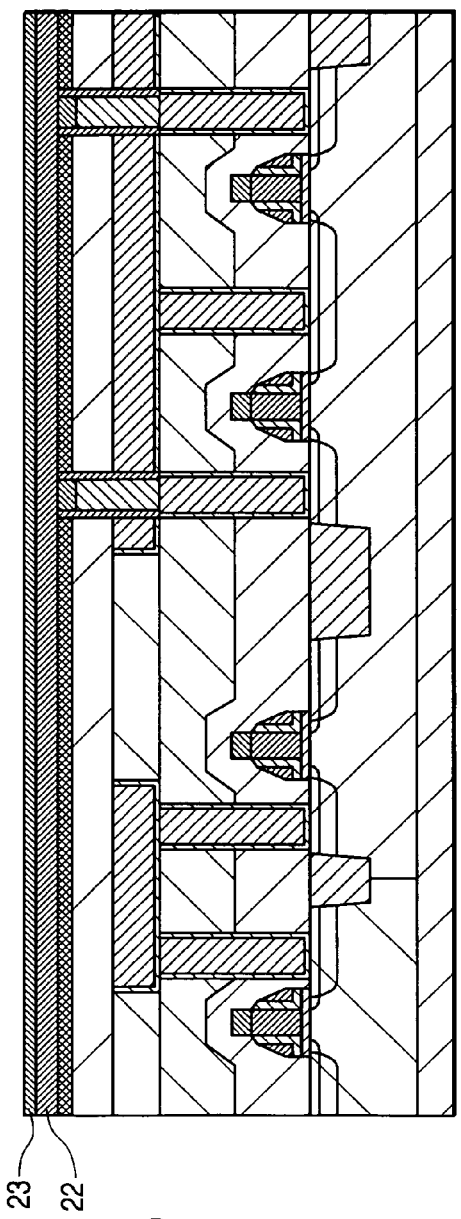
FIG. 32 is a sectional view of the principal parts of a substrate of Embodiment 3 of a semiconductor integrated circuit device according to the invention during a fabrication process.

With the present embodiment, the phase-shift-material-peel-preventive film 21, a phase change recording material film 22, and a phase change recording material film 23, are subsequently deposited, whereupon a structure as shown in FIG. 32 is formed.

Figure 33:
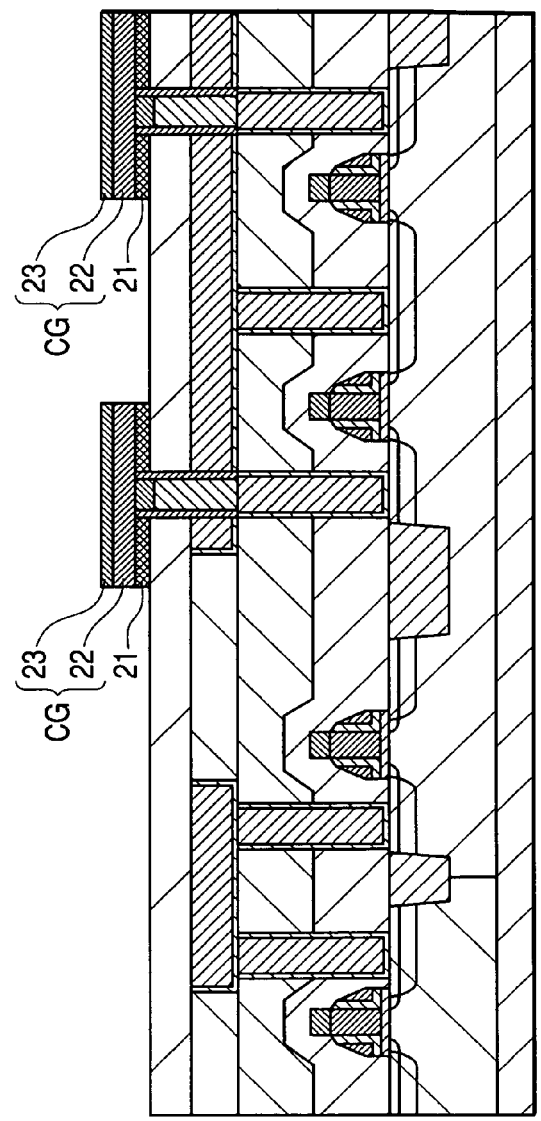
FIG. 33 is another sectional view of the principal parts of the substrate of Embodiment 3 of the semiconductor integrated circuit device according to the invention during the fabrication process.

Subsequently, the phase-shift-material-peel-preventive film 21, phase change recording material film 22, and phase change recording material film 23, are worked into the phase change material layers CG, whereupon a structure as shown in FIG. 33 is formed.

Figure 34:
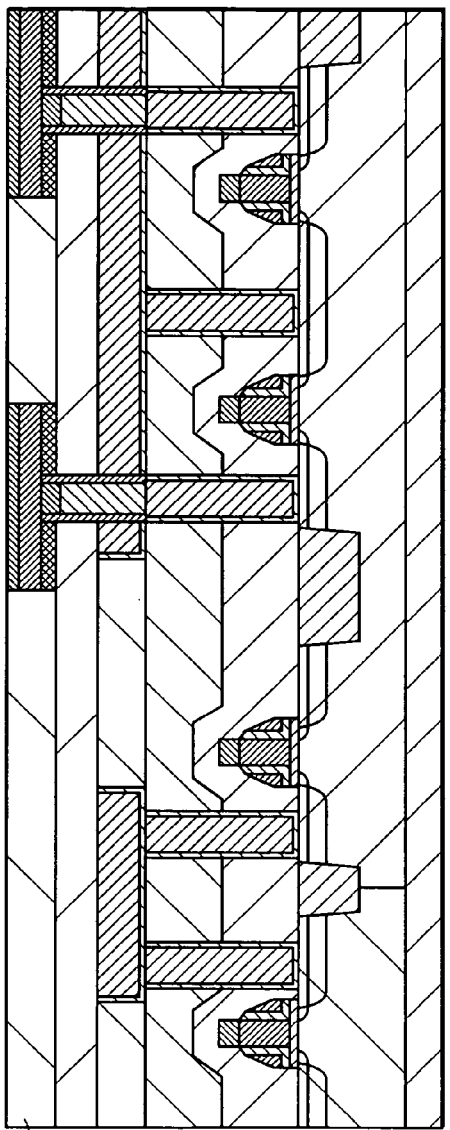
FIG. 34 is still another sectional view of the principal parts of the substrate of Embodiment 3 of the semiconductor integrated circuit device according to the invention during the fabrication process.

Subsequently, an inter-level film 11g is deposited, and the upper surface of the phase change material layer is exposed by etching back the inter-level film 11g by use of, for example, the CMP, whereupon a structure as shown in FIG. 34 is formed.

Figure 35:
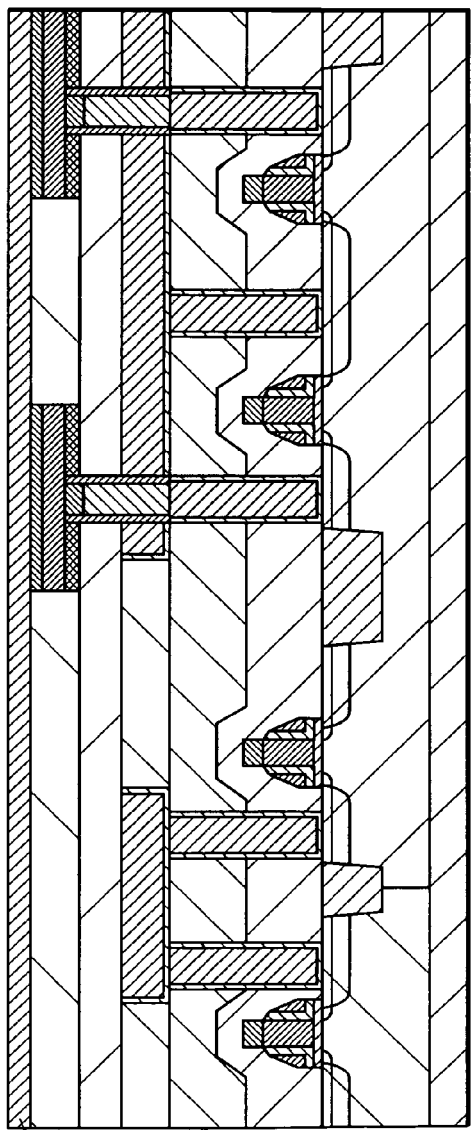
FIG. 35 is a further sectional view of the principal parts of the substrate of Embodiment 3 of the semiconductor integrated circuit device according to the invention during the fabrication process.

Then, for example, a tungsten film 24 is deposited, whereupon a structure as shown in FIG. 35 is formed.

Figure 36:
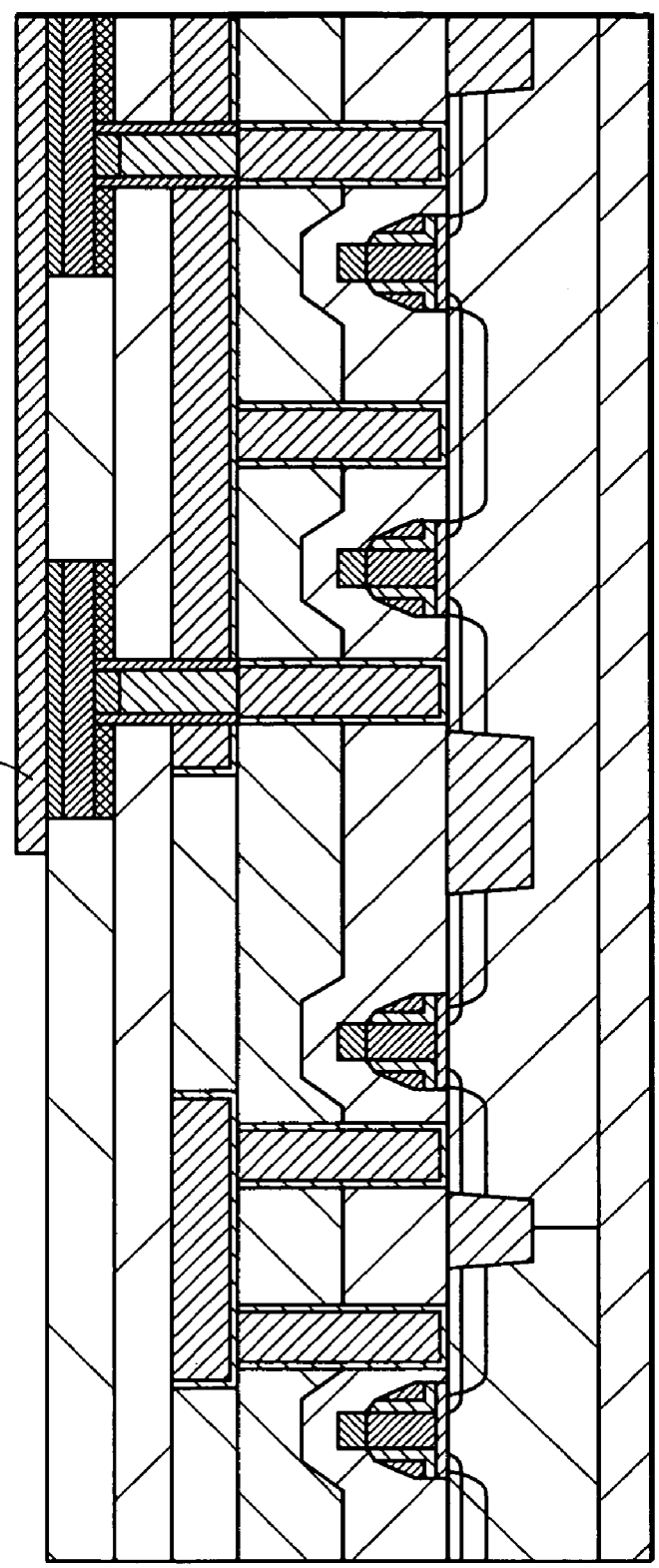
FIG. 36 is a still further sectional view of the principal parts of the substrate of Embodiment 3 of the semiconductor integrated circuit device according to the invention during the fabrication process.

Subsequently, the tungsten film 24 is worked into a memory cell upper plate electrode, whereupon a structure as shown in FIG. 36 is formed.

Figure 37:
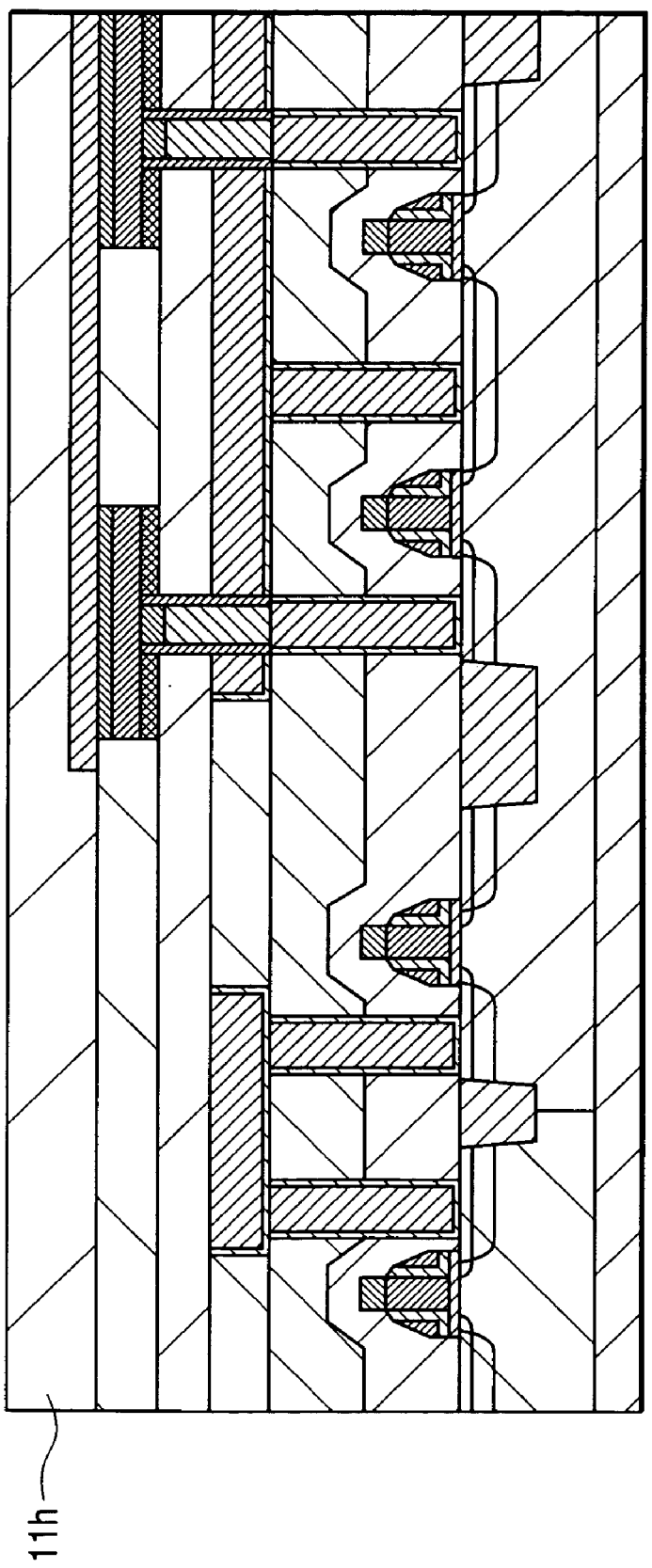
FIG. 37 is a yet further sectional view of the principal parts of the substrate of Embodiment 3 of the semiconductor integrated circuit device according to the invention during the fabrication process.

Subsequently, an inter-level film 11h is deposited, whereupon a structure as shown in FIG. 37 is formed.

Figure 38:
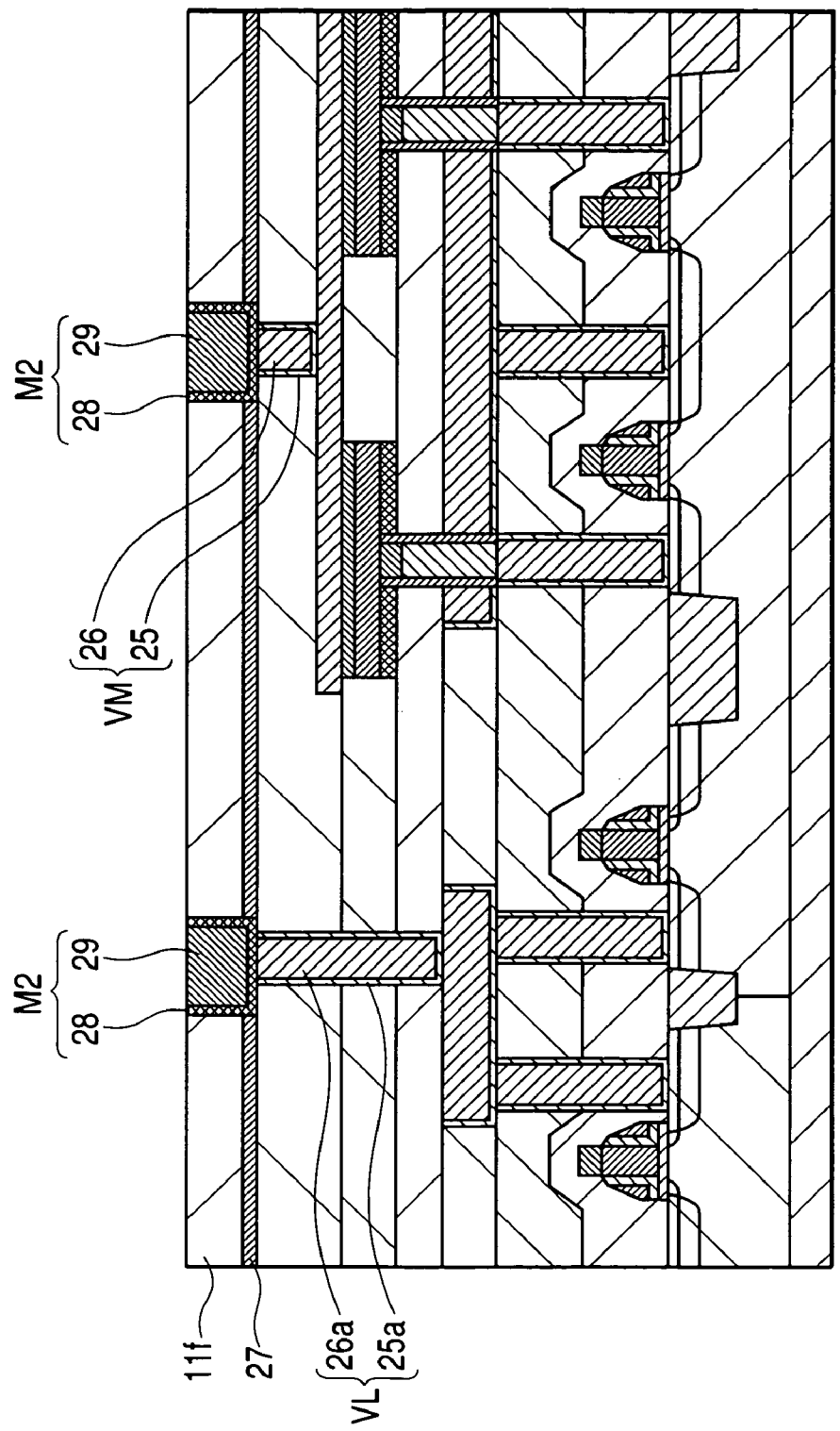
FIG. 38 is a sectional view of the principal parts of the substrate of Embodiment 3 of the semiconductor integrated circuit device according to the invention.

A fabricating method thereafter is the same as that in the case of Embodiment 1, and after a second layer interconnect is formed, a structure becomes as shown in FIG. 38.

With the present embodiment, the upper plate electrode is formed on the phase change material layers. In the case of the upper plate electrode sharing a plurality of the phase change material layers in order to dispose a bit line under the respective phase change material layers, memory cells can be disposed without being affected by disposition of the bit lines and bit line plugs, so that high integration of a memory cell can be achieved by suppressing area penalty for the sake of uniformity in the electrical characteristics of the memory cell elements, and enhancement in reliability of the memory cell elements.

Figure 46:
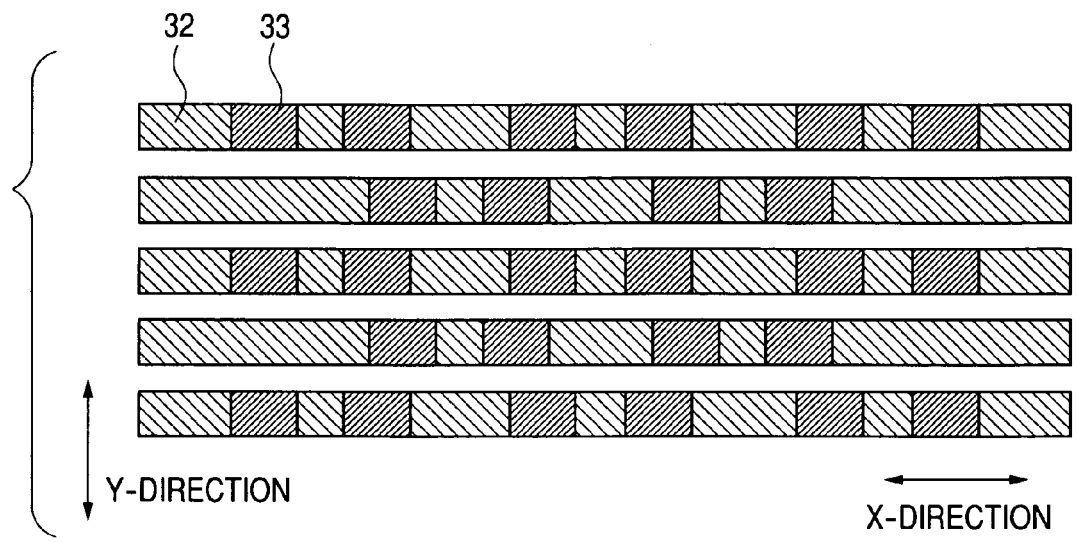
FIG. 46 is a layout view of the principal parts of Embodiment 3 of the semiconductor integrated circuit device according to the invention.

Further, with the present embodiment, as shown in a layout view of the principal parts of respective interfaces between the phase change material layers and the memory cell upper plate electrode, in FIG. 46, the memory cell upper plate electrode 32 may be divided so as to in parallel with the respective bit lines.

Still further, with the present embodiment, the memory cell upper plate electrode may be divided in an optional shape provided that the same is in contact with the upper surface of the respective phase change material layers serving as the respective memory cell elements, having a sufficient contact area.

<Embodiment 4>

The present embodiment relates to a structure wherein a bit line layer is stacked on top of a resistor element, and the bit line layer as stacked is separated along the direction of word lines, in other word, is disposed so as not to be separated along the direction of bit lines.

Figure 49:
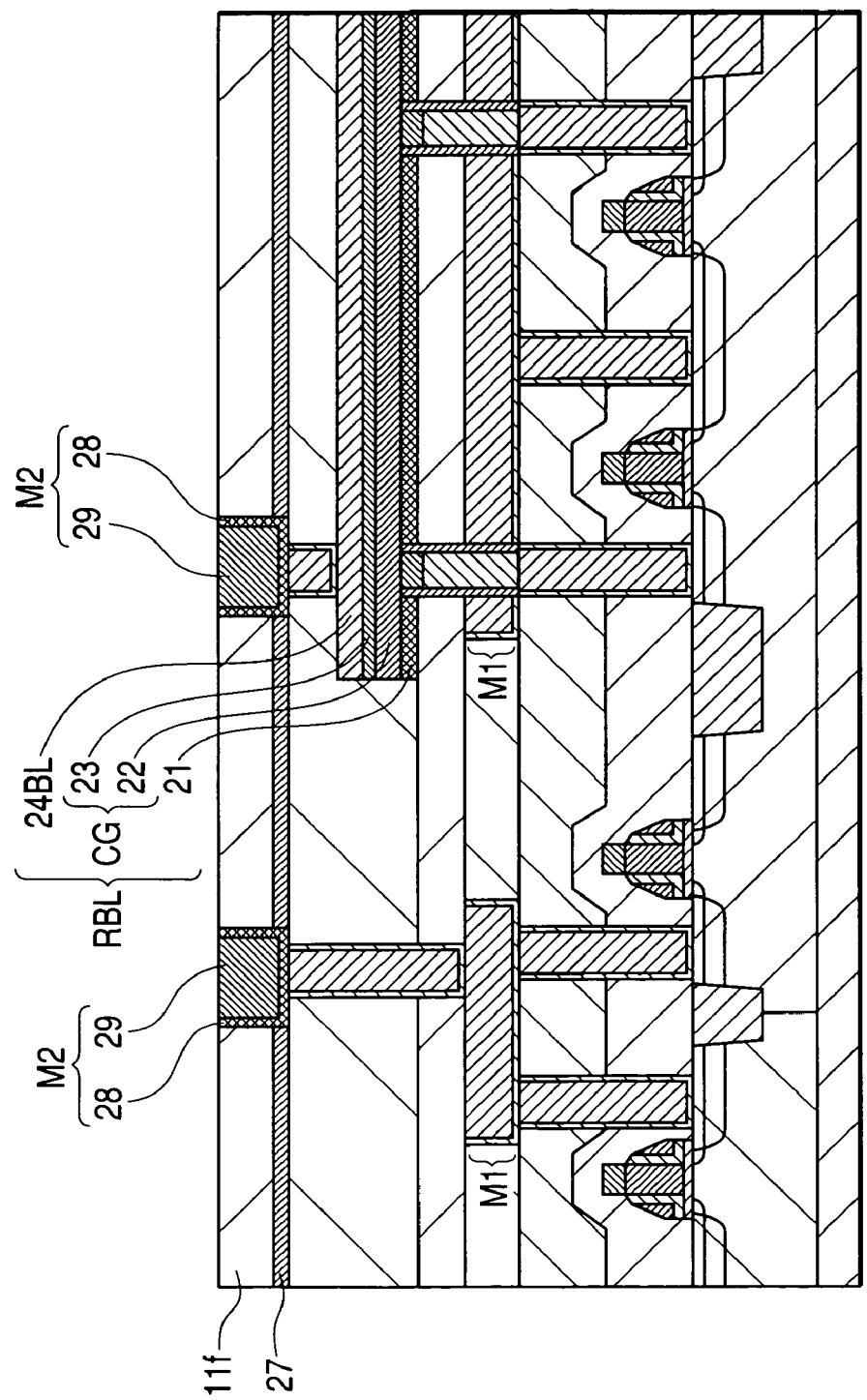
FIG. 49 is a sectional view of the principal parts of Embodiment 4 of a semiconductor integrated circuit device according to the invention.

A method of fabricating a semiconductor integrated circuit device according to Embodiment 4, up to the steps of depositing a phase-shift-material-peel-preventive film 21, phase change recording material film 22, phase change recording material film 23, and tungsten film 24BL is the same as the fabricating method according to Embodiment 1, comprising the steps of depositing the phase-shift-material-peel-preventive film 21 made of silicon nitride, phase change recording material film 22, phase change recording material film 23, and memory cell upper plate electrode 24 made of tungsten, as shown in FIGS. 4 through 13, omitting therefore description thereof. Subsequently, with present embodiment, the phase-shift-material-peel-preventive-film 21, phase change recording material 23, and tungsten film 24BL are worked into a stacked layer RBL of the resistor element and the bit line layer, whereupon a structure as shown in FIG. 49 is formed. A fabrication method thereafter is the same as that according to Embodiment 1.

With present embodiment, the tungsten film 24BL serves as the bit lines. The bit lines are stacked on top of the resistor element, that is, are disposed on top of the resistor element. Further, a first layer interconnect M1 disposed under the resistor element does not serve as the bit lines, but serves as, for example, ground wiring.

Figure 51:
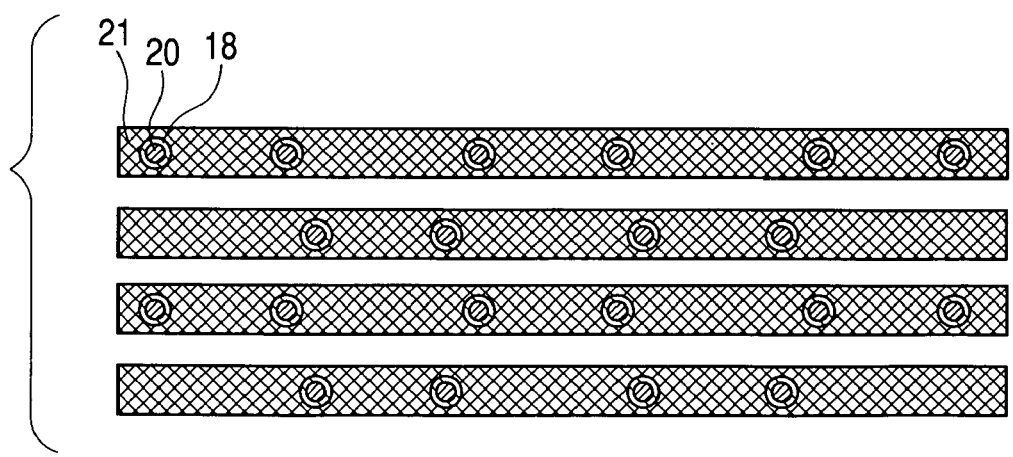
FIG. 51 is another layout view of the principal parts of Embodiment 4 of the semiconductor integrated circuit device according to the invention.

With present embodiment, the phase change material layer is divided by the bit line cycle as shown FIG. 51. This shape enables high integration of a memory cell by suppressing area penalty for the sake of uniformity in the electrical characteristics of memory cell elements, and enhancement in reliability of the memory cell elements owing to the effect that sidewalls of the phase change material layer as divided are not exposed in the direction of the bit lines.

Figure 50:
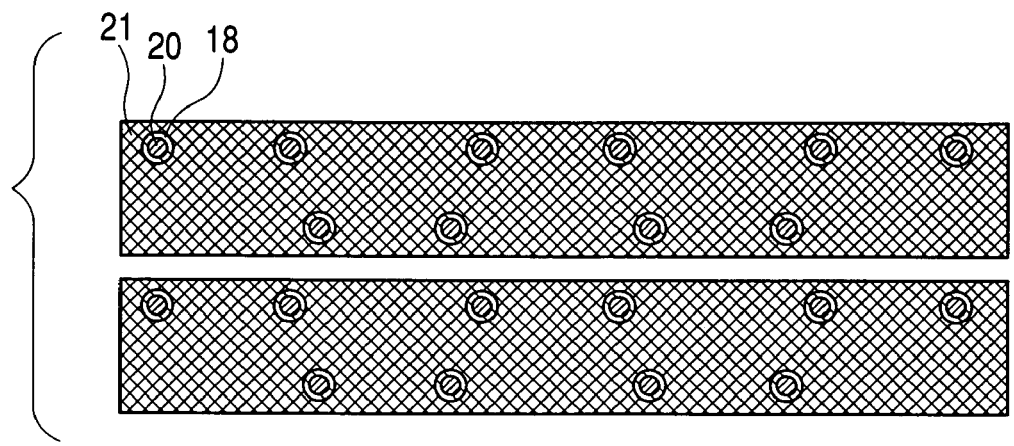
FIG. 50 is a layout view of the principal parts of Embodiment 4 of the semiconductor integrated circuit device according to the invention.

Further, with present embodiment, by adopting a two-intersecting point cell disposition for element active areas as shown in FIG. 18, a stacked layer RBL of the resistor element and the bit line layer may be divided once every two bit lines so that the element active areas adjacent to each other are not selected by the same word line. In this case, a layout of disposition of the stacked layer RBL of the resistor element and the bit line layer against plugs of memory cell lower contact electrodes is as shown in FIG. 50. In this connection, with the adoption of the two-intersecting point cell disposition for the element active areas as shown in FIG. 18, memory cells are disposed such that the memory cells adjacent to each other, on the same word line, are not selected by the respective bit lines shown in FIG. 50. With present embodiment, since the phase change material layer including the upper metal electrode are used as the bit lines, the sidewalls of the phase change material layer as divided are not exposed in the direction of the bit lines and between two of the bit lines, not selected by the same word line, thereby enables high integration of a memory cell by suppressing area penalty for the sake of uniformity in the electrical characteristics of memory cell elements, and enhancement in reliability of the memory cell elements.

As described in the foregoing, the invention developed by the inventor has been specifically described with reference to the embodiments thereof, however, it goes without saying that the invention is not limited thereto, and various modifications may be made therein without departing from the spirit and scope of the invention.

Advantageous effects obtained by representative embodiments of the invention as disclosed by the present application are broadly described as follows.

By providing the phase change material layer for common use and forming the plate electrode in the upper part thereof, it becomes possible to suppress lack of uniformity in electrical characteristics of a phase change memory, and deterioration in reliability thereof, due to working on the phase change material layer.

Further, by disposing the high resistive conductive material only in the upper part of each of the contact electrodes connecting the phase change material layer with the semiconductor areas of the MISFETs for selection of the memory cell, in other word, by disposing the high resistive conductive material such that portions of the contact electrodes, in contact with the phase change material layer, only act as the heaters generating Joule heat, formation of the phase change areas is speeded up and the refresh speed of the respective memory cell elements can be enhanced.

Further, since the phase change material layer is disposed above the bit lines, the memory cell elements can be disposed at high integration by suppressing the area penalty without being affected by the bit line contact electrodes, so that the phase change memory can be mounted jointly with the logic in the semiconductor integrated circuit device by use a process having affinity for the system-on-chip process.

What is claimed is:

1. A semiconductor integrated circuit device having a plurality of memory cells formed on a semiconductor substrate, each made up by electrically connecting a resistor element in series with a field effect transistor comprising:
a plurality of first electrodes each connected to the field effect transistor which is included in a corresponding one of the plurality of memory cells;
a stacked layer film formed of a phase change material layer and a second electrode, deposited in that order, and connected to the plurality of first electrodes in common; and
a power source terminal connected to the second electrode layer,
wherein the phase change material layer is made of one phase change material layer or plural phase change material layers with resistance values changing by heating treatments,
wherein the resistor element is a part of the stacked layer film,
wherein a surface area of each of the plurality of first electrodes is smaller than a surface area of the stacked layer film, and
wherein a phase change region is formed in a contact part between one of the plurality of first electrodes and the stacked layer.

2. A semiconductor integrated circuit device comprising a plurality of memory cells formed on a semiconductor substrate, each made up by electrically connecting a resistor element in series with a field effect transistor comprising:
a plurality of first electrodes each connected to either of a source or a drain of the field effect transistor which is included in a corresponding one of the plurality of memory cells;
a conductive film serving as a bit line of the memory cells and connected to the other of the source or the drain of the field effect transistor; and
a stacked layer film made up of a phase change material layer and a second electrode layer, deposited in that order,
wherein the phase change material layer is made of one phase change material layer or plural phase chanae material layers with resistance values changing by heating treatments,
wherein the stacked layer film is formed on the conductive film through the intermediary of an insulation film so as to be connected to the plurality of first electrodes in common,
wherein the resistor element is a part of the stacked layer film,
wherein a surface area of each of the plurality of first electrodes is smaller than a surface area of the stacked layer film, and
wherein a phase change region is formed in a contact part between one of the plurality of first electrodes and the stacked layer.

3. A semiconductor integrated circuit device comprising a plurality of memory cells formed on a semiconductor substrate, each made up by electrically connecting a resistor element in series with a field effect transistor comprising:
a plurality of first electrodes each connected to either of a source or a drain of the field effect transistor which is included in a corresponding one of the plurality of memory cells;
a conductive film serving as a bit line of the memory cells and connected to the other of the source or the drain of the field effect transistor; and
a stacked layer film made up of phase change material layer and a second electrode layer, deposited in that order,
wherein the phase change material layer is made of one phase change material layer or plural phase change material layers with resistance values changing by heating treatments, wherein the stacked layer film is formed on the conductive film through the intermediary of an insulation film and configured such that the phase change material layers are divided by the memory cell and the second electrode layer is common to the plurality of memory cells, wherein the resistor element is a part of the stacked layer film, wherein a surface area of each of the plurality of first electrodes is smaller than a surface area of the stacked layer film, and wherein a phase change region is formed in a contact part between one of the plurality of first electrodes and the stacked layer.

4. A semiconductor integrated circuit device according to claim 1, each of the plurality of first electrodes is a plug layer made up by filling up a contact hole, formed in an insulation film, with a conductive material.

5. A semiconductor integrated circuit device according to claim 4, wherein the plug layer comprises a first plug layer connecting the other of the source and the drain, in the field effect transistor, with the bit lines, and a second plug layer extended on the first plug layer and connected to the first electrode layer.

6. A semiconductor integrated circuit device according to claim 5, wherein the second plug layer is smaller in cross sectional area than the first plug layer.

7. A semiconductor integrated circuit device according to claim 5, wherein the second plug layer has an insulation thin film deposited along an inner peripheral sidewall of the contact hole.

8. A semiconductor integrated circuit device according to claim 5, wherein the second plug layer comprises a first conductive layer having a first resistance value and a second conductive layer having a resistance value higher than the first resistance value, and the second conductive layer is connected to the phase change material layer.

9. A semiconductor integrated circuit device according to claim 1, wherein the phase change material layer comprises stacked layer films formed of a first phase change material layer made of a first melting point material, and a second phase change material layer made of a material having a melting point higher than that of the first melting point material layer, deposited in that order, and the first phase change material layer is connected to either of the source and the drain, in the field effect transistor.

10. A semiconductor integrated circuit device according to claim 1, wherein the phase change material layer comprises a first phase change material layer in a crystallized state.

11. A semiconductor integrated circuit device according to claim 1, wherein the phase change material layer comprises a second phase change material layer in an amorphous state.

12. A semiconductor integrated circuit device according to claim 1, wherein the phase change material layer comprises stacked layer films formed of a first phase change material layer in a crystallized state, and a second phase change material layer in an amorphous state, deposited in that order, and the first phase change material layer is connected to either of the source and the drain, in the field effect transistor.

13. A semiconductor integrated circuit device according to claim 1, wherein the phase change material layer comprises stacked layer films formed of a first phase change material layer in an amorphous state, and a second phase change material layer in a crystallized state, deposited in that order, and the first phase change material layer is connected to either of the source and the drain, in the field effect transistor.

14. A semiconductor integrated circuit device according to claim 1, wherein the phase change material layer comprises stacked layer films formed of a first phase change material layer in an amorphous state, and a second phase change material layer in a crystallized state, deposited in that order, and the first phase change material layer is connected to either of the source and the drain, in the field effect transistor, with a plug layer formed in an insulation film, having an area where a portion of the first phase change material layer is crystallized due to Joule heat generated by flow of current to the plug layer.

15. A semiconductor integrated circuit device according to claim 1, wherein any material selected from the group consisting of TiN, TiAlN, and PolySi is provided in a portion of the second plug layer, connected to the resistor element.

16. A semiconductor integrated circuit device according to claim 1, wherein a molybdenum material is provided in a portion of the second plug layer, connected to the resistor element.

* * * * *